(12) United States Patent
White et al.

(10) Patent No.: US 10,454,772 B2
(45) Date of Patent: Oct. 22, 2019

(54) COMPACT UNINTERUPTABLE POWER SUPPLY

(71) Applicant: Vapor IO Inc., Austin, TX (US)

(72) Inventors: Steven White, Austin, TX (US); Dave Kaplin, Austin, TX (US)

(73) Assignee: Vapor IO Inc., Austin, TX (US)

(*) Notice: Subject to any disclaimer, the term of this patent is extended or adjusted under 35 U.S.C. 154(b) by 377 days.

(21) Appl. No.: 15/200,961

(22) Filed: Jul. 1, 2016

(65) Prior Publication Data

US 2017/0126054 A1 May 4, 2017

Related U.S. Application Data

(66) Substitute for application No. 62/275,909, filed on Jan. 7, 2016.
(Continued)

(51) Int. Cl.
*H02J 7/00* (2006.01)
*H02J 9/06* (2006.01)
(Continued)

(52) U.S. Cl.
CPC .......... *H04L 41/12* (2013.01); *G06K 7/10366* (2013.01); *G06K 7/10881* (2013.01); *G06K 7/1413* (2013.01); *G06K 19/06028* (2013.01); *G06K 19/07758* (2013.01); *H01R 12/721* (2013.01); *H01R 25/16* (2013.01); *H02H 7/20* (2013.01); *H02J 7/0052* (2013.01); *H02J 9/061* (2013.01); *H02M 3/158* (2013.01); *H02M 7/04* (2013.01); *H02M 7/44* (2013.01); *H04L 67/10* (2013.01); *H04L 67/12* (2013.01); *H04L 67/18* (2013.01); *H04L 67/22* (2013.01); *H05K 5/0069* (2013.01); *H05K 7/1488* (2013.01);
(Continued)

(58) Field of Classification Search
None
See application file for complete search history.

(56) References Cited

U.S. PATENT DOCUMENTS 5,063,475 A 11/1991 Balan
6,133,526 A 10/2000 Lebo et al.
(Continued)

OTHER PUBLICATIONS

Wireless data centers could be faster, cheaper, greener, http://www.news.cornell.edu/stories/2012/09/wireless-data-centers-could-be-faster-cheaper-greener, Sep. 26, 2012, pp. 1 to 2.
(Continued)

*Primary Examiner* — Jared Fureman
*Assistant Examiner* — Aqeel H Bukhari
(74) *Attorney, Agent, or Firm* — Pillsbury Winthrop Shaw Pittman LLP

(57) ABSTRACT

Provided is a device, including: a power supply comprising: a battery configured to output direct current (DC) power at a first voltage and a first current; a battery charger coupled to the battery and configured to charge the battery; a power-converter configured to receive DC power from the battery and convert the DC power to output DC power at a second voltage and a second current, the second voltage being less than half the first voltage and the second current being greater than twice the first current; and an interface to couple output power from the power-converter to a bus-bar power interface of a rack configured to hold computing equipment.

22 Claims, 17 Drawing Sheets

Related U.S. Application Data

(60) Provisional application No. 62/248,788, filed on Oct. 30, 2015, provisional application No. 62/262,477, filed on Dec. 3, 2015.

(51) Int. Cl.

| | | |
|---|---|---|
| *H02M 3/158* | (2006.01) | |
| *H02M 7/44* | (2006.01) | |
| *H04L 12/24* | (2006.01) | |
| *G06K 7/10* | (2006.01) | |
| *G06K 7/14* | (2006.01) | |
| *G06K 19/06* | (2006.01) | |
| *G06K 19/077* | (2006.01) | |
| *H04L 29/08* | (2006.01) | |
| *H01R 12/72* | (2011.01) | |
| *H01R 25/16* | (2006.01) | |
| *H02H 7/20* | (2006.01) | |
| *H02M 7/04* | (2006.01) | |
| *H05K 5/00* | (2006.01) | |
| *H05K 7/14* | (2006.01) | |
| *H05K 7/20* | (2006.01) | |
| *H04L 12/10* | (2006.01) | |
| *H04W 4/02* | (2018.01) | |

(52) U.S. Cl.
CPC ....... *H05K 7/1498* (2013.01); *H05K 7/20736* (2013.01); *H05K 7/20836* (2013.01); *H04L 12/10* (2013.01); *H04W 4/023* (2013.01)

(56) References Cited

U.S. PATENT DOCUMENTS

| | | |
|---|---|---|
| 7,133,289 B2 | 11/2006 | Arippol |
| 7,426,110 B2 | 9/2008 | Malone et al. |
| 7,508,663 B2 | 3/2009 | Coglitore |
| 7,573,715 B2 | 8/2009 | Mojaver et al. |
| 7,688,593 B2 | 3/2010 | Byers et al. |
| 7,697,305 B2 | 4/2010 | Meyer et al. |
| 7,907,402 B2 | 3/2011 | Caveney |
| 8,297,067 B2 | 10/2012 | Keisling et al. |
| 8,320,125 B1 | 11/2012 | Hamburgen et al. |
| 8,867,204 B1 | 10/2014 | Gardner |
| 9,001,456 B2 | 4/2015 | Campbell et al. |
| 2002/0020683 A1 | 2/2002 | Broome |
| 2002/0098792 A1 | 7/2002 | Hsiao |
| 2002/0100736 A1 | 8/2002 | Lopez |
| 2002/0140327 A1 | 10/2002 | Kim |
| 2002/0149911 A1 | 10/2002 | Bishop et al. |
| 2003/0031449 A1 | 2/2003 | Simmons et al. |
| 2003/0124971 A1 | 7/2003 | Williams |
| 2003/0128516 A1 | 7/2003 | Faneuf et al. |
| 2004/0132398 A1 | 7/2004 | Sharp et al. |
| 2005/0024825 A1 | 2/2005 | Smith et al. |
| 2005/0201073 A1 | 9/2005 | Pincu et al. |
| 2005/0265004 A1 | 12/2005 | Coglitore et al. |
| 2006/0209475 A1 | 9/2006 | Cabrera et al. |
| 2006/0215363 A1 | 9/2006 | Shipley et al. |
| 2007/0064383 A1 | 3/2007 | Tanaka et al. |
| 2008/0151497 A1 | 6/2008 | Lai et al. |
| 2009/0178986 A1 | 7/2009 | Coglitore et al. |
| 2009/0251860 A1 | 10/2009 | Belady et al. |
| 2009/0308579 A1 | 12/2009 | Johnson et al. |
| 2010/0151781 A1 | 6/2010 | Slessman et al. |
| 2010/0317278 A1 | 12/2010 | Novick |
| 2011/0011626 A1 | 1/2011 | Yamauchi et al. |
| 2011/0014862 A1 | 1/2011 | Honold et al. |
| 2011/0133620 A1 | 6/2011 | Coglitore et al. |
| 2011/0317971 A1 | 12/2011 | Zhang et al. |
| 2012/0016290 A1 | 1/2012 | Shin |
| 2012/0103843 A1 | 5/2012 | Wei |
| 2012/0111817 A1 | 5/2012 | Sweeny et al. |
| 2012/0128507 A1 | 5/2012 | Scheidler |
| 2012/0134096 A1 | 5/2012 | Zhang |
| 2013/0107450 A1 | 5/2013 | Zhang et al. |
| 2013/0120931 A1 | 5/2013 | Sankar et al. |
| 2013/0133350 A1 | 5/2013 | Reytblat |
| 2014/0113539 A1 | 4/2014 | Dickinson et al. |
| 2014/0137491 A1 | 5/2014 | Somani et al. |
| 2014/0177163 A1 | 6/2014 | Wiley |
| 2014/0185225 A1 | 7/2014 | Wineland |
| 2014/0268528 A1 | 9/2014 | Mick |
| 2014/0307375 A1 | 10/2014 | Mann et al. |
| 2015/0090679 A1 | 4/2015 | Obernesser et al. |
| 2015/0097518 A1* | 4/2015 | Bishop .............. H02J 7/0003 320/107 |
| 2015/0129514 A1 | 5/2015 | Bourdoncle et al. |
| 2015/0244268 A1* | 8/2015 | Meinecke ........... H02M 3/158 323/271 |
| 2015/0245531 A1* | 8/2015 | Meinecke ........... H02M 3/158 361/679.02 |
| 2015/0289405 A1 | 10/2015 | Stewart et al. |
| 2016/0079777 A1* | 3/2016 | Bhardwaj .......... H01M 10/443 320/107 |
| 2016/0107312 A1 | 4/2016 | Morrill et al. |
| 2016/0248381 A1* | 8/2016 | Yang ..................... H03F 3/193 |

OTHER PUBLICATIONS

Wild New Design: Data Center in a Silo, http://www.datacenterknowledge.com/archives/2009/12/10/wild-new-design-data-center-in-a-silo/, Dec. 10, 2009, pp. 1 to 6.
Calcul gets creative with data center cooling design, http://searchdatacenter.techtarget.com/photostory/2240169084/New-book-takes-you-inside-unique-energy-efficient-data-centers/3/Calcul-gets-creative-with-data-center-cooling-design, Oct. 23, 2012, pp. 1 to 3.
International Search Report & Written Opinion for Related Application PCT/US2016/021515, dated Jun. 17, 2016, pp. 1 to 13.
International Search Report & Written Opinion or Related Application PCT/US2016/021521, dated Jun. 20, 2016, pp. 1 to 13.
International Search Report & Written Opinion for Related Application PCT/US2016/034328, dated Aug. 24, 2016, pp. 1 to 12.
Non-Final Office Action for Related U.S. Appl. No. 15/065,181, dated Aug. 12, 2016, pp. 1 to 25.
Non-Final Office Action for Related U.S. Appl. No. 15/065,201, dated Aug. 12, 2016, pp. 1 to 18.
Non-Final Office Action for Related U.S. Appl. No. 15/165,590, dated Aug. 30, 2016, pp. 1 to 24.

* cited by examiner

COMPACT UNINTERUPTABLE POWER SUPPLY

CROSS-REFERENCE TO RELATED APPLICATIONS

The present application claims the benefit of the following U.S. Provisional Patent Applications: U.S. 62/248,788, filed 30 Oct. 2015; U.S. 62/262,477, filed 3 Dec. 2015; and U.S. 62/275,909, filed 7 Jan. 2016. The entire content of each parent application is incorporated by reference in its entirety.

BACKGROUND

1. Field

The present invention relates generally to electrical power supplies and, more specifically to uninterruptible power supplies.

2. Description of the Related Art

Computer racks, such as server racks, are generally used to house and in some cases interconnect collections of computing devices, like servers and associated storage, power supplies, network switches, and the like. In many cases, the computing devices are relatively numerous and arranged in a relatively high-density array due to the cost of space appropriate to store such computing devices and the desire to reduce latency by having the devices close to one another.

Often, the computing devices run computing applications having higher up-time goals than can be provided by grid electrical power. Power outages can cause data centers to cease operations. In some cases, backup power supplies, such as diesel generators and batteries are used to supply backup power in the event of a power outage. But in many cases, these systems are too slow to respond to an outage (e.g., many diesel generators), or are larger than is desired for modular data center rack designs, where the backup power supply is built into a rack (e.g., many battery-based backup power supplies).

SUMMARY

The following is a non-exhaustive listing of some aspects of the present techniques. These and other aspects are described in the following disclosure.

Some aspects include a device, including: a power supply comprising: a battery configured to output direct current (DC) power at a first voltage and a first current; a battery charger coupled to the battery and configured to charge the battery; a power-converter configured to receive DC power from the battery and convert the DC power to output DC power at a second voltage and a second current, the second voltage being less than half the first voltage and the second current being greater than twice the first current; and an interface to couple output power from the power-converter to a bus-bar power interface of a rack configured to hold computing equipment.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
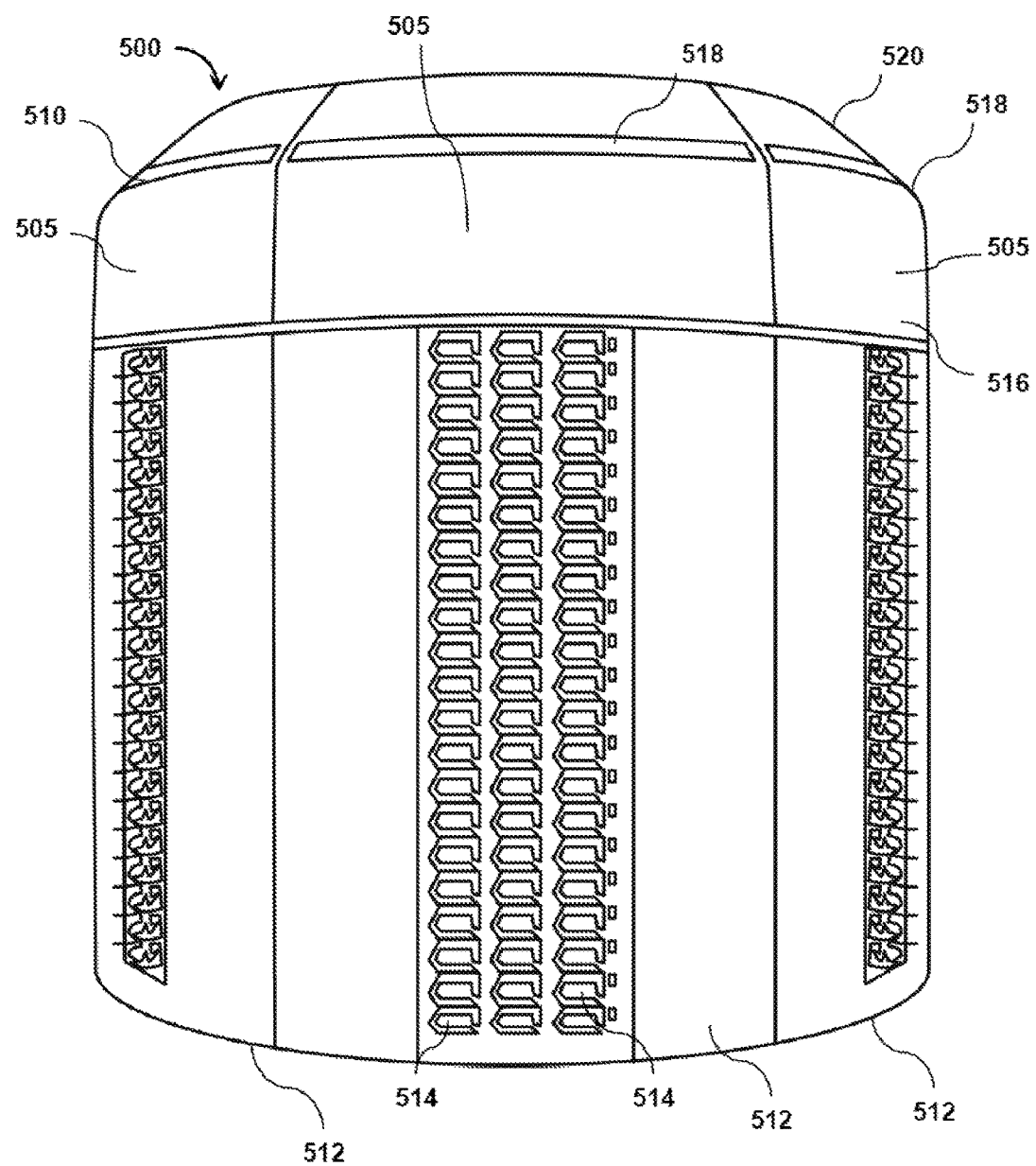
FIG. 1 illustrates an example of a cylindrical datacenter chamber, in accordance with some embodiments.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of data center and power supply design. Indeed, the inventors wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

Batteries suitable for datacenter uninterruptible power supplies are too big, particularly for modular data center racks having on-board backup power supplies. This is often due to the current requirements of some computing equipment. For specified voltage and current loads, the batteries tend to be larger than is desirable when placing the backup power supply in the rack or adjacent the rack.

As explained below, some embodiments render relatively small batteries suitable for use as backup power supplies in a data center. To this end, or others described below, some embodiments convert relatively high-voltage, low-current battery output power to a lower voltage, higher current power source. As a result, a relatively small battery may supply adequate current. In some cases, this is accomplished in the context of a computing environment described below with reference to FIGS. 1-13 and 17, though embodiments of the power supply have applicability outside this context.

Figure 3:
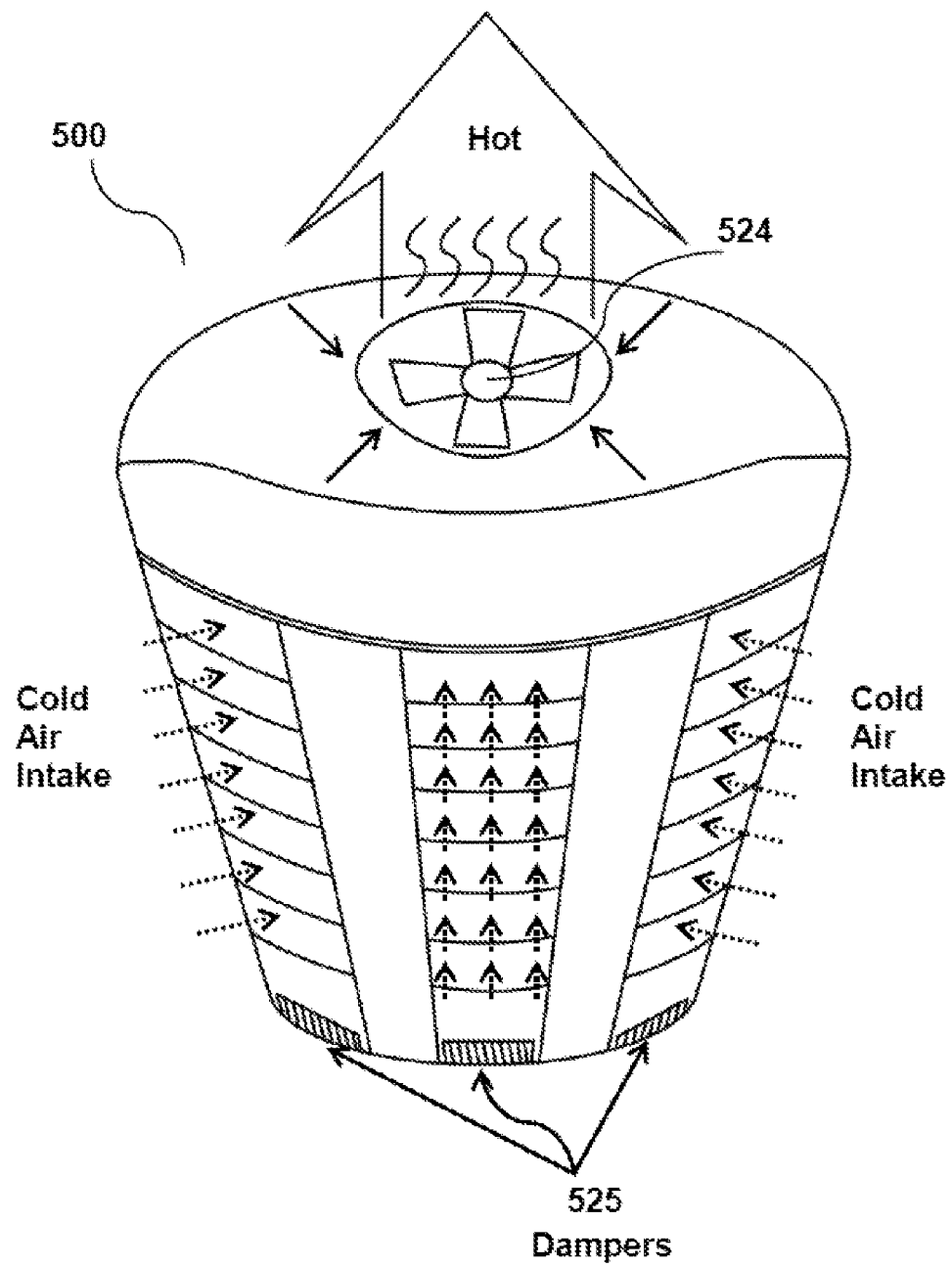
FIGS. 3-4 illustrate operation of the cylindrical datacenter chamber of FIG. 1, in accordance with some embodiments.
Figure 4:
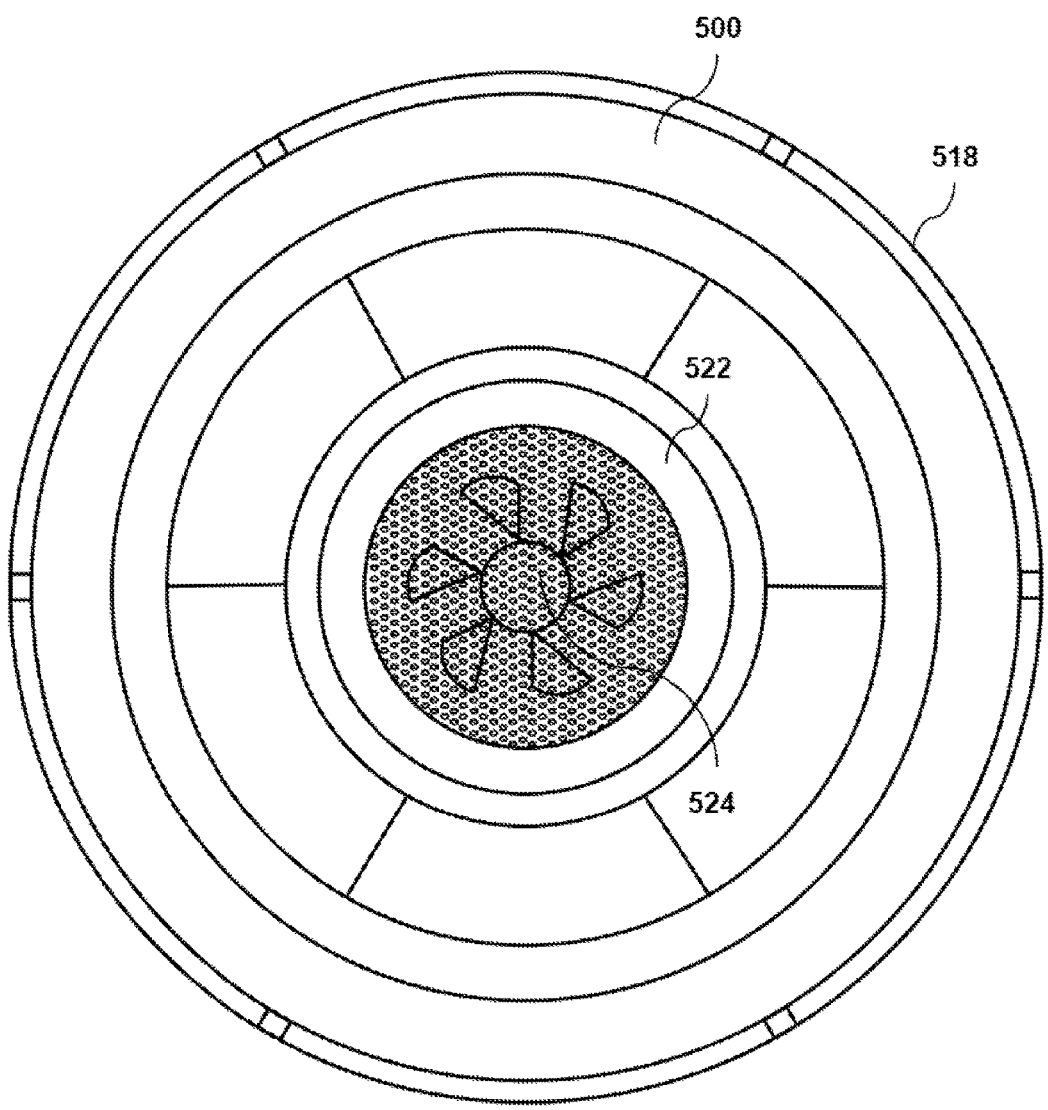
Figure 5:
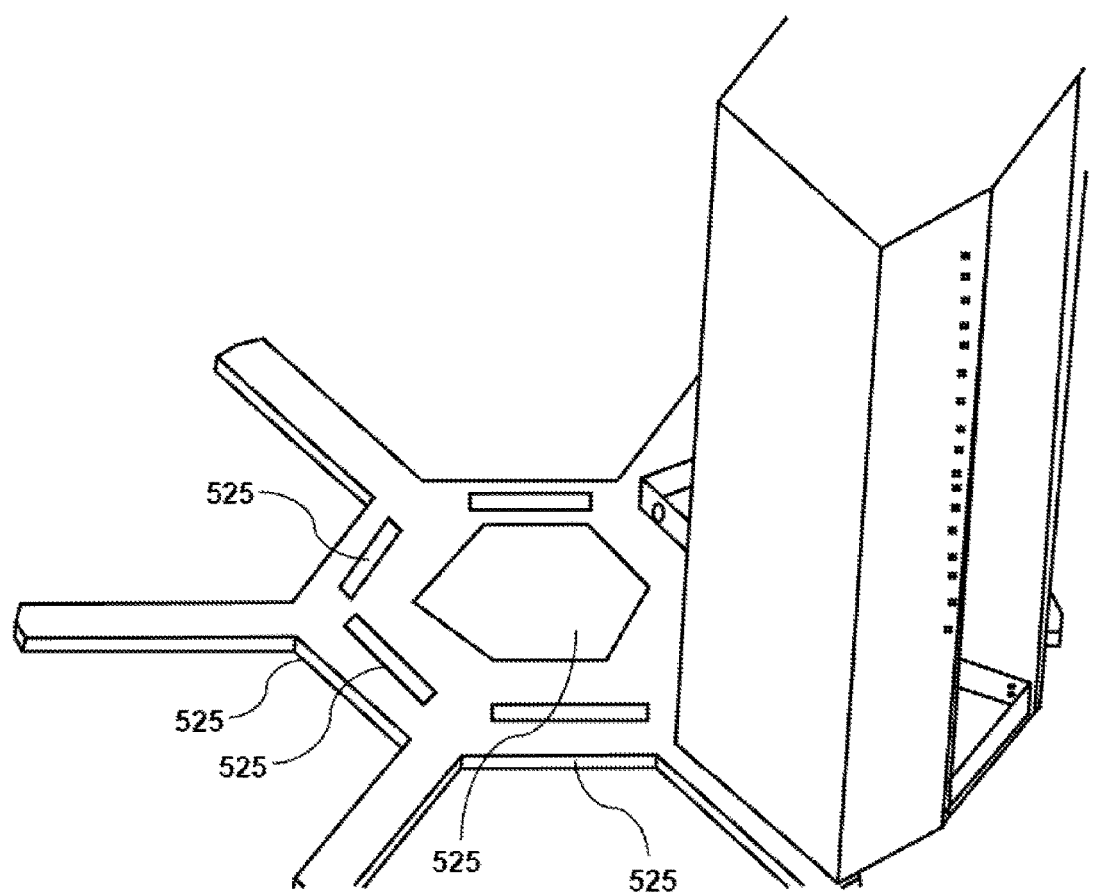
FIG. 5 illustrates examples of components of the cylindrical datacenter chamber of FIG. 1, in accordance with some embodiments.

FIG. 1 depicts an embodiment of a datacenter chamber 500 in accordance with some of the present techniques. In some embodiments, datacenter 500 includes a collection of adjacent racks arrayed non-linearly (e.g., in a circle, oval, square, etc.) so as to at least partially define an interior chamber (e.g., by fully enclosing the interior chamber in a horizontal plane, or by partially enclosing the interior chamber, like by defining a concave area in the plane). The interior chamber defines a compartment through which cooling fluid flows, in some cases having a substantially an empty space through which cooling fluid like air may flow. Some embodiments may provide for a generally cylindrical datacenter chamber 500, having a plurality of wedge racks, each with a stack of vertically arrayed, outward facing servers. Wedge-shaped racks generally have an outer portion (further from the interior chamber) that is wider than an inner portion (adjacent the interior chamber). This arrangement is expected to allow for relatively easy access to equipment on the wedge racks (e.g., for maintenance, cabling, installation, etc.) An integrated cooling or ventilation system may be provided by which air is drawn or pushed through the inner chamber (e.g., via fans near the top or bottom of the inner chamber as shown in FIGS. 3-4 and described below). Additionally or alternatively, in some embodiments, ducting may be coupled to the column, the data center pressurized, and air may flow through the ducting to a region at a lower pressure (or the ducting may be driven to a lower pressure than a data center at ambient air pressure). Finally, arranging can be challenging due to the weight of the racks, particularly when the body of the racks serves to constrain and direct airflow, often leading to relatively narrow tolerances for mating between adjacent racks. Some embodiments may include a guiding and seating system for aligning the racks during assembly, as described below.

In some cases, the chamber may form a relatively self-contained unit, having cooling infrastructure independent of building-provided heating, ventilation, and air conditioning (HVAC). In some cases, the chamber may also have power conditioning circuitry (e.g., rectifiers, low-pass filters, and surge-protectors) and back-up power supplies (e.g., batteries). In some embodiments, each chamber includes an integrated, self-contained compute fabric by which computing devices are interconnected. A relatively self-contained chamber 500 as described above may provide benefits such as easy shipping, easy access to components within the chamber, cost effective heat and humidity control, and independency from other infrastructure (e.g., datacenter building, other datacenter units, etc.). That said, several independently useful inventions are described, so not all embodiments provide all of these benefits.

FIG. 1 shows an example of a chamber 500 including a plurality of racks 505 configured to hold arrays of rack-mounted computing devices 514. Racks 505 are arranged non-linearly (e.g., in a rotationally symmetric array) to define chamber 500 and the interior chamber (shown in later views). Racks 505, in some embodiments, are "wedge racks" shaped to define the interior chamber when placed adjacent one another, for instance, by forming a wedge-shape in their horizontal cross section. In some embodiments, wedge racks 505 may be arranged into a shape such as a triangle, square, hexagon, or octagon with the back sides all facing towards (and in some cases partially or entirely defining) the interior chamber. In some embodiments, the chamber 500 may have a generally cylindrical shape, e.g., a circular cylindrical shape. In some embodiments, the chamber 500 may be generally rotationally symmetric about a vertical axis extending through the center of the chamber 500. In some embodiments, the interior chamber of datacenter chamber 500 (shown in FIGS. 3 and 4) may generally be of cylindrical shape. In some cases, the interior chamber of datacenter chamber 500 may define (e.g., approximate) a right cylinder with a base having a variety of shapes consistent with the present techniques, e.g., a rectangular, triangular, pentagonal, hexagonal, heptagonal, octagonal, decagonal, dodecagonal, or elliptical. In some cases, the interior chamber may define a tapered shape, such as an inverted cone, in which the diameter of the bottom is larger than the top or vice versa.

In some embodiments, chamber 500 provides front side rack access (the outer perimeter of the chamber) to access three categories of information technology interfaces (e.g., of computing devices 514): compute; network, and storage. In some embodiments, the components by which the computing devices are connected to power and one another may be accessible from the exterior of the chamber, e.g., the inner column may be generally or fully devoid of such connections, or alternate connections may be accessible from the exterior. (Or some embodiments may include such connections in the interior.)

In some embodiments, a lid 510 is configured to fit on top of the wedge racks. Lid 510 may include an upper portion 520 and a lower portion 516 (on the opposite side of the upper portion vertically) and an illumination strip 518, behind which may reside an array of light emitting diodes connected to a rack controller. Light color, intensity, and flashing rates or patterns may indicate status of computing devices in the rack. Lid 510 may define an empty chamber space located between lower portion 516 (where lid 510 and the wedge racks connect) and upper portion 520 of lid 510. The empty space may be house wiring and a top-of-rack network switch in some embodiments. In some cases, chamber 500 may include a leveling base 512 described with reference to FIGS. 11-13.

In some cases, the number of wedge racks 505 is at least three racks, e.g., five racks or six racks, or more. In some embodiments, each wedge rack 505 may be substantially identical to the other wedge racks, and each receptacle, called a "U" in each rack may be substantially identical to the others. In some embodiments, when assembled, the orientation of the wedge racks may differ by an amount less than 180 degrees, e.g., less than 90 degrees. In some embodiments, as described below, each wedge rack may be engineered with a holistic embedded systems engineering methodology to allow the rack to function as a "device"/"appliance", and not as a traditional rack/row architecture, which is expected to be particularly advantageous in web-scale applications. In some embodiments, chamber 500 may eliminate traditional "U's" of measurement by integrating the "pitch" into the chamber itself. That said, embodiments are not limited to systems that provide these benefits, as various independently useful techniques are described here, which is not to suggest that any other feature may not be omitted in some cases.

In some cases, the datacenter chamber 500 may house more than 50 U's of computing devices 514 and may span more than 5 feet in diameter (e.g., approximately 9 feet). Further, in some cases, the racks in the chamber may be approximately the height of a person, e.g., on the order of six feet tall to facilitate access by technicians (e.g., five feet or higher). In some embodiments, one or more datacenter chambers may be part of a modular data center that can be placed where data capacity is needed. This may allow for rapid deployment, energy efficiency, high-density computing, and cost reduction (though embodiments are also consistent with a non-modular design).

Figure 2:
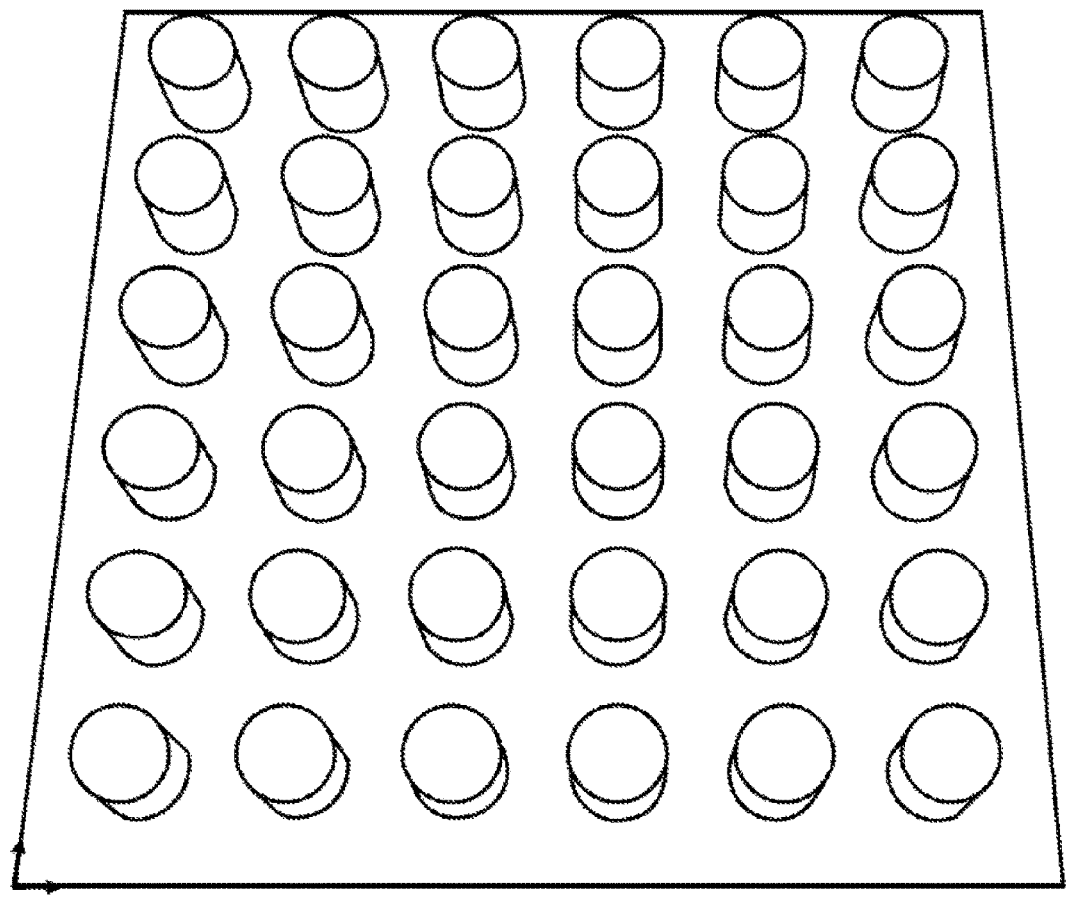
FIG. 2 illustrates a datacenter having an array of cylindrical datacenter chambers of FIG. 1, in accordance with some embodiments.

In some embodiments, a plurality of datacenter chamber 500 may be may be arranged in a datacenter. FIG. 2 illustrates an example of a datacenter having an array of cylindrical datacenter chambers. In some embodiments, the chambers may be arranged in a square or a hexagonal lattice, or other arrangements. In some cases, one or more datacenter chambers 500 may be added to existing data centers with or without similar characteristics (e.g., having different server rack units). In some embodiments, one or more datacenter chambers 500 may be containerized for easy transportation. For example, datacenter chambers 500 (with or without datacenter equipment) may be configured to fit into a standard shipping container, which is then transported to a desired location. Datacenter chamber 500 may be advantageous for use in portable data center environments at least because of its integrated cooling or ventilation system capacity as will be discussed below.

Controlling air temperature and humidity in the chamber (and in a datacenter in general) is expected to help protect equipment from malfunction and damage. In some cases it may also reduce power consumption and cost. For example, temperatures in a datacenter chamber 500 may rise because of the amount of power used in the datacenter chamber which may cause heat damage to equipment on the wedge racks. High humidity may cause water to condense on internal components within the datacenter chamber. Low humidity may cause static electricity discharge problems which may damage components within the datacenter chamber. A variety of arrangements may direct air to flow circumferentially inward or outward to cool rack-mounted computing equipment. In the illustrated embodiment, wedge racks 505 of chamber 500 (FIG. 1) are arranged into a cylindrical shape (or they may be arranged in other shapes described above such as a square, hexagon, or octagon with the back sides all facing towards the center). This, in some cases, allows outside cold air to be pulled (or pushed) in from several (e.g., all horizontal) directions to cool equipment in chamber 500. The cold (e.g., relative to the computing equipment) air may flow over the computing devices, drawing heat therefrom, and into the interior cylinder. From the cylinder, the air may be exhausted through a fan that drives the airflow as shown by the arrows in FIG. 3.

The incoming air is heated as it passes across heatsinks (pulling waste heat from computing equipment) and other warm components inside the equipment, in these embodiments. In some embodiments, the hot air exits the backs of the wedge racks and enters the inner chamber and exits through the top of the chamber. FIGS. 3-4 illustrate operation of the chamber of FIG. 1, in accordance with some embodiments. Cold air may be pulled or pushed from all directions of chamber 500, drawn to the inner chamber and exits through an exhaust output (e.g., output 522 of FIG. 4) in the top of chamber 500. (Or the flow may be reversed.) In some embodiments, a lid (e.g., lid 510 of FIG. 1) configured to cover the top of the chamber serves as a barrier that prevents the hot air from mixing back in with the cold air. In some embodiments, a fan 524 in FIGS. 3-4, or an array of fans may be arranged and positioned in the top of the lid and configured to pull the hot air upward. In some cases, the fan may be configured to pull the hot air into ductwork that routes the air elsewhere.

In some embodiments, chamber 500 may include dampers configured to adjust the flow of air. FIG. 3 illustrates an example of dampers 525. In some cases, dampers 525 in FIGS. 3 and 5, located at the base of the chamber may be used to adjust the flow of air. In some embodiments, the dampers may include one or more valves, or plates configured to control, stop, or regulate the flow of air inside chamber 500. In some embodiments, one or more dampers may be manual (e.g., using a manual handle to control the damper), or automatic (e.g., using motors that are controlled by a thermostat). Industry recommended temperatures generally range between 64 and 81° F., a dew point range between 41 and 59° F., and a maximum relative humidity of 60. In some embodiments, temperatures may range between 59 and 90° F.

In some embodiments, chamber 500 may include an integrated cooling system configured for directing air to flow circumferentially inward or outward to cool rack-mounted computing equipment, for instance, by driving a cooling fluid along computing devices mounted in the wedge racks of chamber 500 and through the interior chamber of chamber 500. The present techniques are described with reference to a cooling gas (air), but are consistent with other fluids, e.g., in systems immersed in mineral oil. In some embodiments, the integrated cooling system of chamber 500 is independent from other cooling systems (e.g., for other chambers in the datacenter, for the room where the datacenter is located, or for the building where the datacenter is located). In some cases, the integrated cooling system of chamber 500 may be controlled in concert with other cooling systems for other chambers, for the room or for the building. Cooling systems, humidifiers, ventilators, or other temperature and humidity control systems may be used to help control air temperature and humidity. In some embodiments, the integrated cooling system of chamber 500 may be configured to provide cooling and humidity control by directly drawing fresh air into the cooling system (e.g., through a vent, duct, etc.) In some embodiments, the integrated cooling system may be a portable cooling system. In other cases, the integrated cooling system maybe an integral part of chamber 500 (e.g., part of the chassis described below).

The integrated cooling system of chamber 500 may use one or more different techniques for forcing air to flow over computing equipment mounted in the wedge-shaped racks. For example, the cooling system may drive a cooling fluid (e.g., air, gas, water, chemicals, or other cooling fluids) along equipment in chamber 500 and through the interior chamber with a pump, like a centrifugal pump, in the case of liquids, or a fan, in the case of gasses. The cool fluid is heated as it passes through equipment and is driven out of the chamber. For example in case of air or other gasses, the heated fluid may be driven out by a fan located near an end of the interior chamber e.g., top (or located elsewhere within, or near to chamber 500) to a duct or a vent. Or in the case of cooling liquids, the heated liquid may be directed out of the chamber and into a heat exchanger using a pump.

For instance, in some embodiments, chamber 500 may include an integrated ventilation infrastructure. In some embodiments, the integrated ventilation infrastructure of chamber 500 is independent of other ventilation systems of other chambers, room, or building. In some cases, the integrated ventilation infrastructure may be controlled in concert with ventilation of other chambers in the datacenter, ventilation of the room, or building. In some embodiments, the ventilation infrastructure may include one or more fans in series or parallel. In some embodiments, the integrated ventilation infrastructure includes a plurality of motors attached to a fan through controlled clutches.

Figure 6:
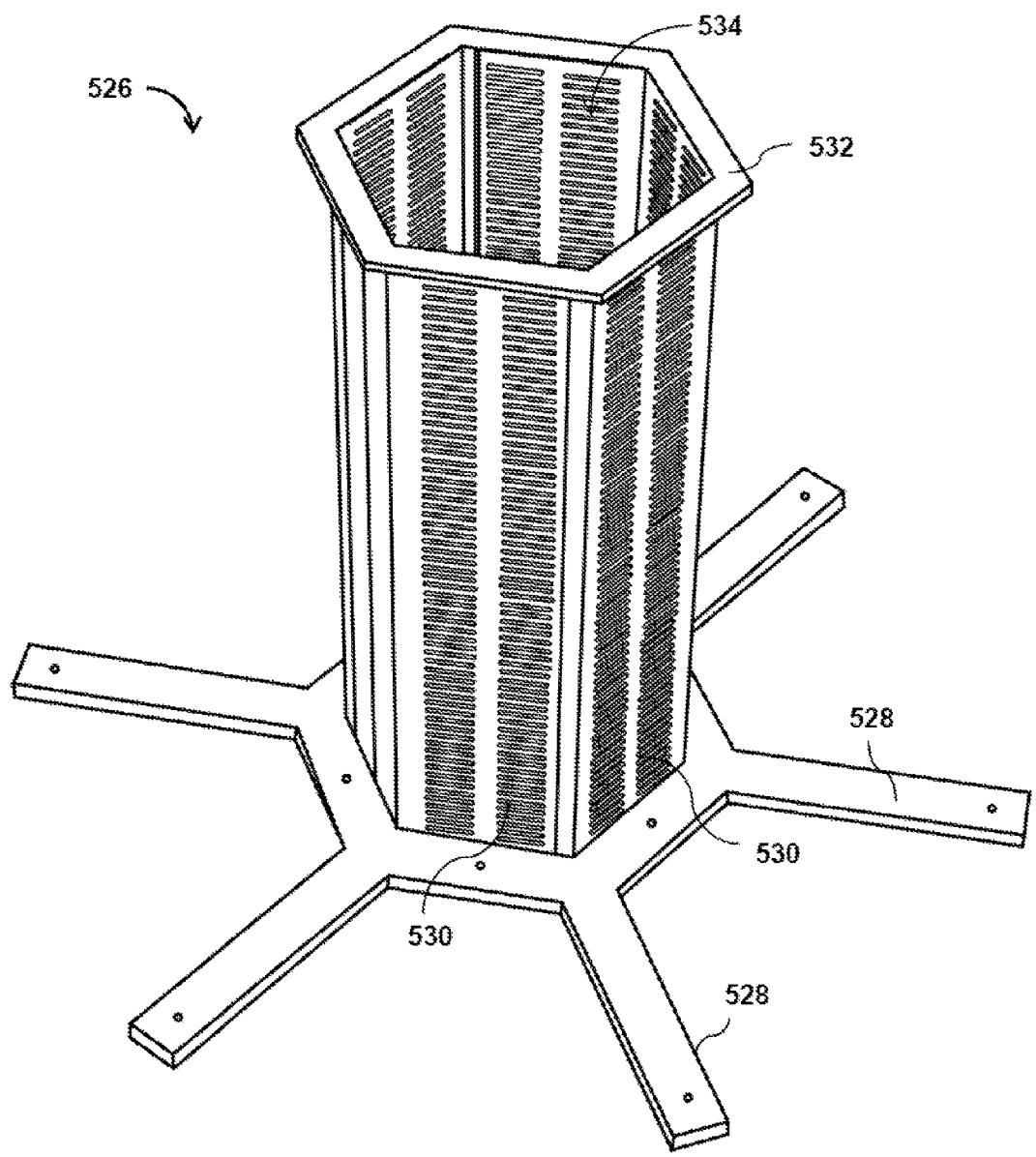
FIG. 6 illustrates a chassis of the cylindrical datacenter chamber of FIG. 1, in accordance with some embodiments.

FIG. 6 illustrates a chassis of the datacenter chamber 500 of FIG. 1, in accordance with some embodiments. Chassis 526 may be configured to secure one or more racks in spaced relation relative to one another. Chassis 526 may be configured to position the racks facing at least three different directions, e.g., six directions in the illustrated example. Wedge rack 536 (FIG. 7) is secured to chassis 526 such that chamber 536 is facing outward from the interior chamber defined by the back side of chamber 536 and the back side of other racks when secured to chassis 526. This may eliminate the need to reach the back side of the chamber (for maintenance, computing, networking, etc.), as opposed to existing rack cabinets which necessitate access to the back of the rack cabinets for operating some functions of the equipment, servicing, or securing the equipment. Existing rack cabinets are usually placed in single rows forming aisles between them to allow access to the back of the rack cabinets.

In some embodiments, chassis 526 includes a chamber brace 532 configured to connect to a leveling base 528 of chassis 526. Brace 532 is a multi-surface brace. Each surface is configured to receive a wedge rack. In some embodiments, brace 532 may be configured to fit within leveling base 528. In some cases brace 532 may be configured to fit on top of leveling base 528. In some embodiments, brace 532 and leveling base 528 may be configured to be removably connected (screws for example). In some embodiments, brace 532 and leveling base 528 may be permanently connected (e.g., welded, or permanently glued together).

In some embodiments, chassis 526 may include baffles 530/534 configured for directing air for an efficient air flow within chamber 500 (e.g., for cooling, ventilation, heat exchange, etc.) In some cases, the baffles may make airflow more uniform into or out of the chamber. Different rack-mounted computing devices may obstruct air differently, potentially leading to areas of high flow and other areas of low flow. The low flow areas may not be adequately cooled. To mitigate this issue, the baffles may constrain airflow and, thereby, account for a substantial portion of the pressure drop between the interior and exterior of the chamber. As a result, it is expected that computing-device specific differences in the pressure drop will account for a smaller portion of the total pressure drop, thereby evening fluid flow. In some embodiments, the baffles may be in the form of vanes, panels, orifices, or other forms. In some embodiments, the baffles may be one or more of longitudinal, horizontal, or other type of baffles.

In some embodiments, baffles 530/534 may include baffles configured to vary airflow restriction vertically along the length of the interior chamber to reduce the likelihood of positive pressure developing in the downstream end of the interior chamber. Positive pressure on what is intended to be the downstream side of the rack, in some use cases, is undesirable, as it can cause hot air to flow back from the interior chamber towards some of the racks, heating rather than cooling computing equipment. For instance, from the bottom of the interior chamber to the top of the interior chamber, the amount of airflow restriction provided may progressively increase, e.g., from an unobstructed region along one quarter of the length, to a partially obstructed region spanning the next quarter of the length, to an even more obstructed region spanning the next quarter of the length, and finally to a fully obstructed portion for the final quarter. A variety of structures may be used to partially obstruct airflow. Examples include arrays of holes drilled in a plate (like in a hexagonal lattice), with hole size and density decreasing as airflow obstruction increases. In some embodiments, airflow restriction may vary smoothly from one end of the chamber to the other, or separate portions may be defined. In some embodiments a filter media of increasing density may vary the resistance to airflow. In some embodiments the varying impediments to flow may be placed at the outer radius of the chamber or intermediate between the inner chamber and outer surface.

Figure 7:
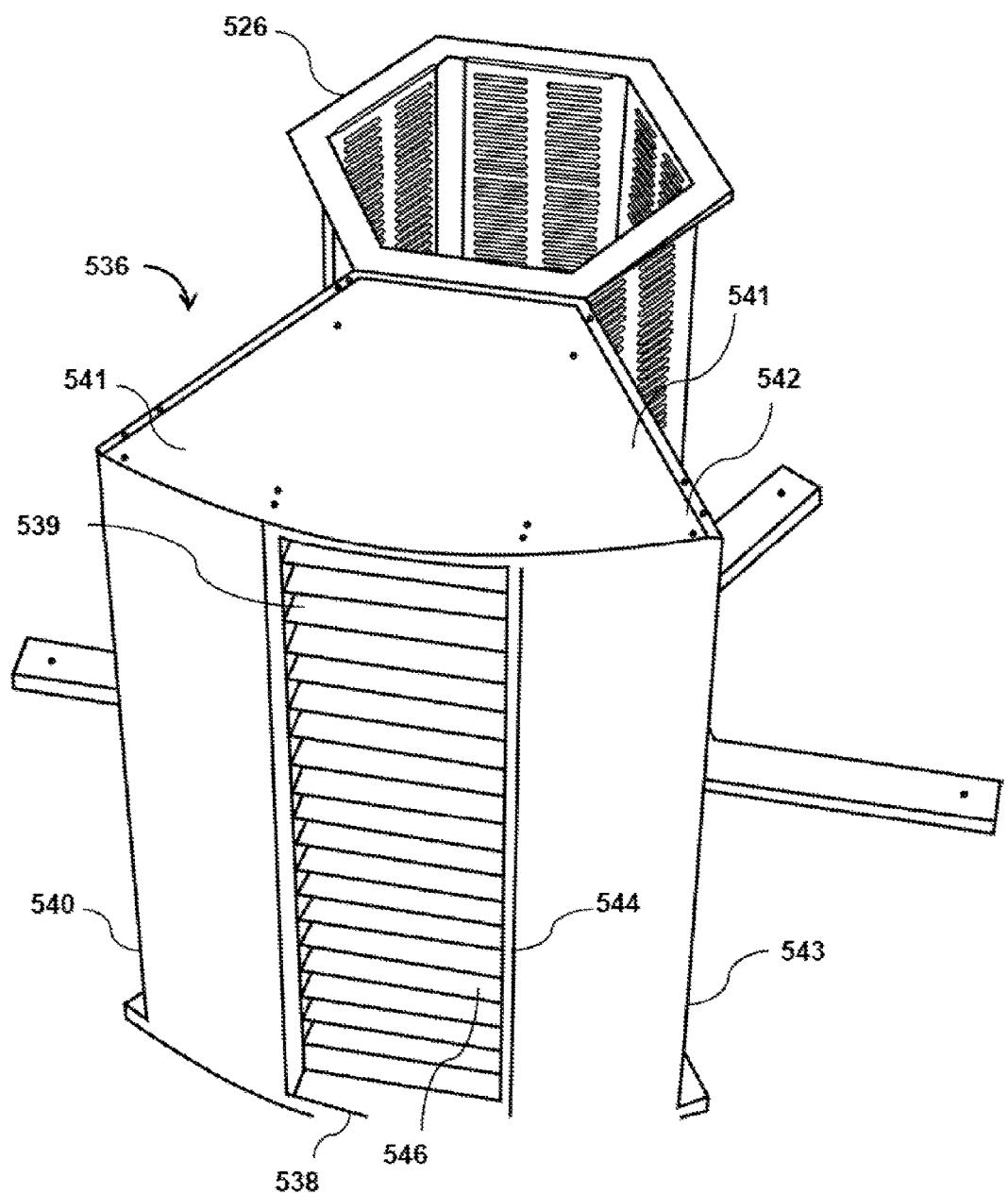
FIG. 7 illustrates a wedge rack of the cylindrical datacenter chamber of FIG. 1, in accordance with some embodiments.

FIG. 7 illustrates an example of a wedge rack 536 positioned on chassis 526. In this example, wedge rack 536 defines a generally wedge-shaped volume 541 along at least one side of the wedge rack. In some embodiments, the wedge rack comprises three articulating panels. A first panel 539 (not shown, but the element number identifies the area covered by the panel) may be configured to selectively provide access to a rack of computing devices 544, a second panel 540 configured to selectively provide access to a first wedge-shaped volume on one side of the rack of computing devices 544, and a third panel 543 configured to selectively provide access to a second wedge-shaped volume on a second side of the rack of computing devices. In some embodiments, computing devices may be disposed on equipment selves 546. First panel 539 may provide front-side access (front side being the opposite side of a back side adjacent to the interior chamber) for compute, network, and storage interfaces for computing devices mounted in the racks. Wedge rack 536 may include wedge rack top cover 542 configured to fit on top of wedge 536. In some embodiments, top cover 542 may be removably connected to the top of wedge 536. In some cases, top cover 542 may be permanently connected to the top of wedge 536.

Figure 8:
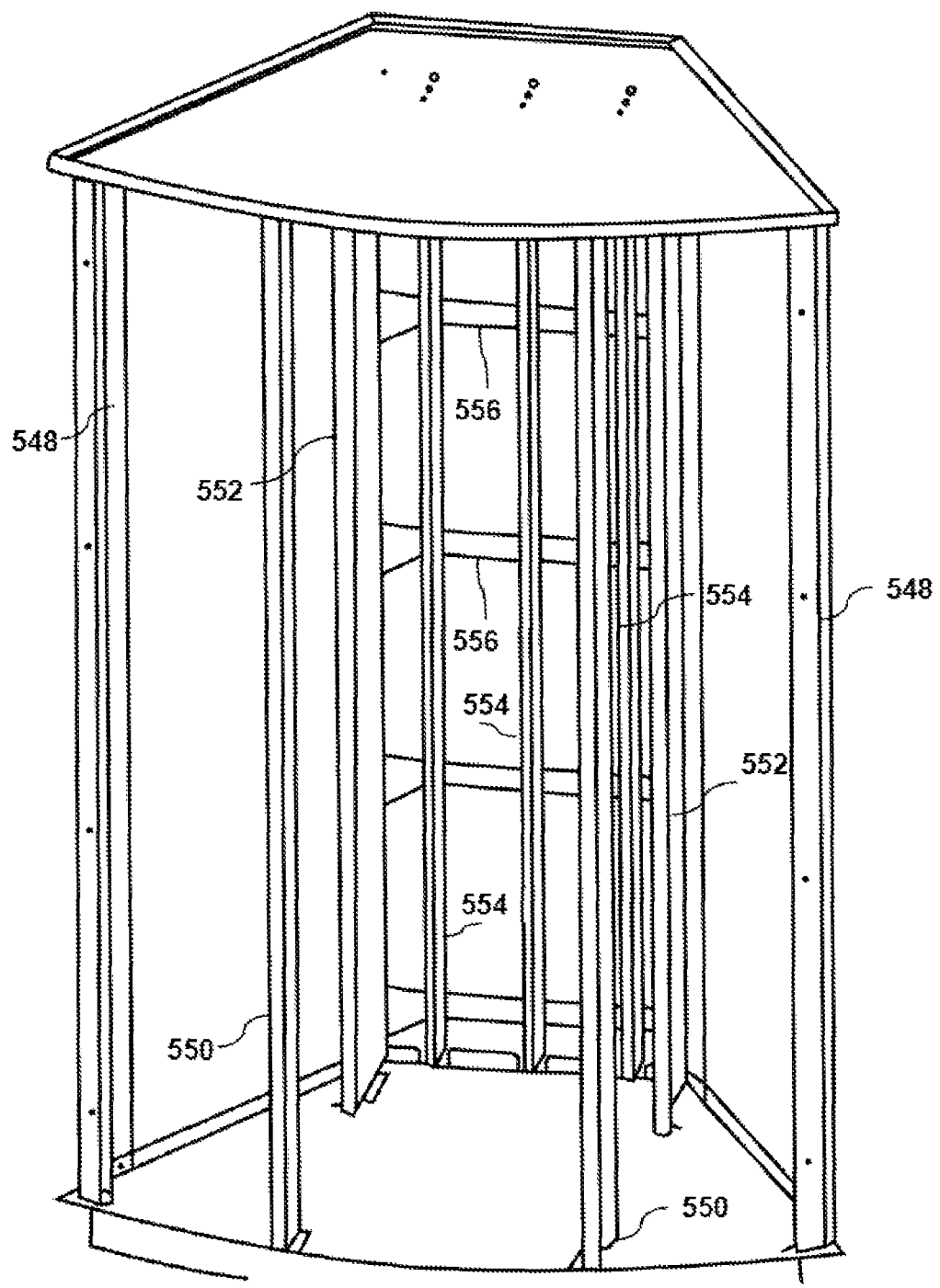
FIGS. 8-10 illustrate examples of components of the wedge rack of the cylindrical datacenter chamber of FIG. 1, in accordance with some embodiments.
Figure 9:
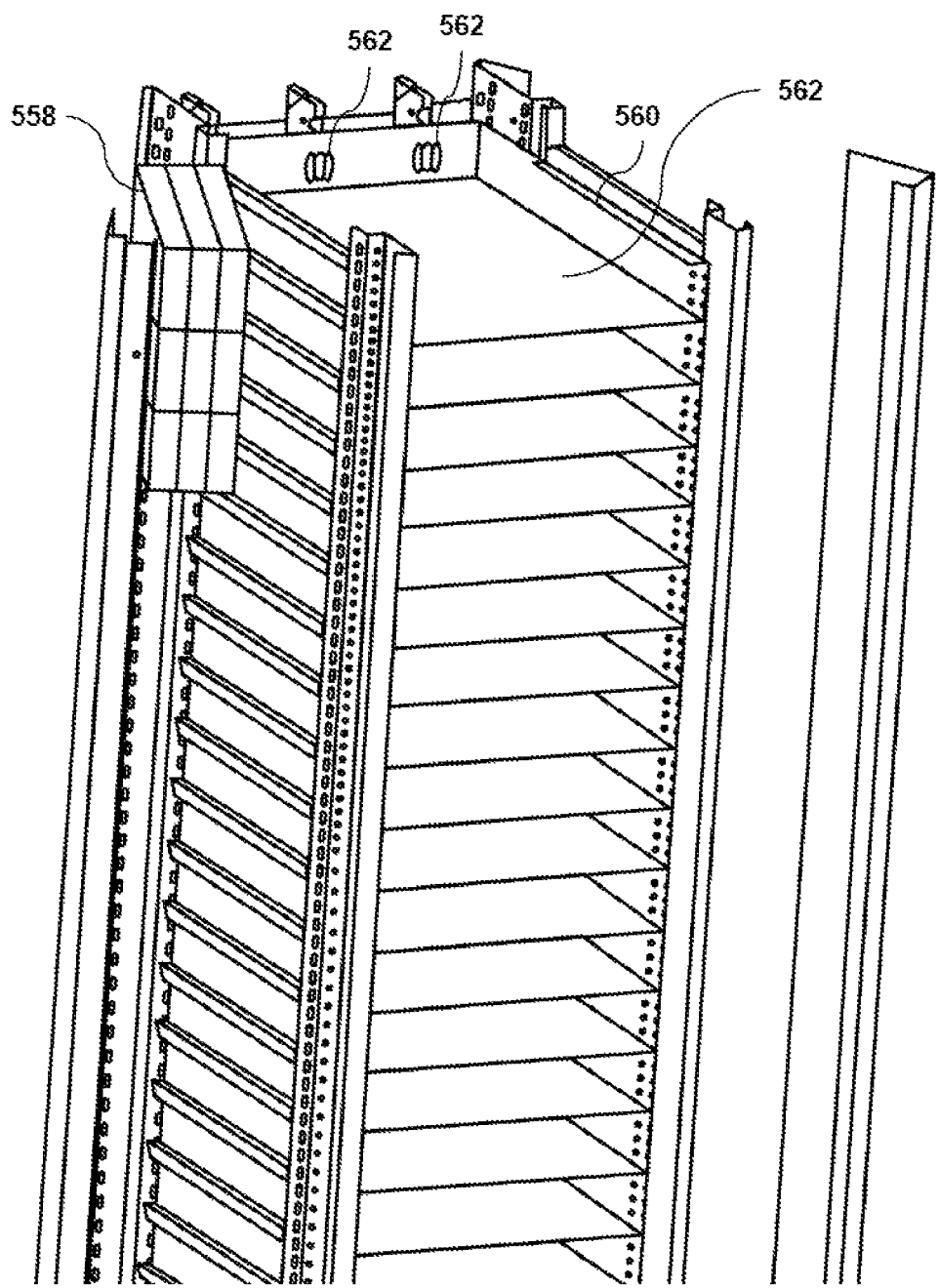
Figure 10:
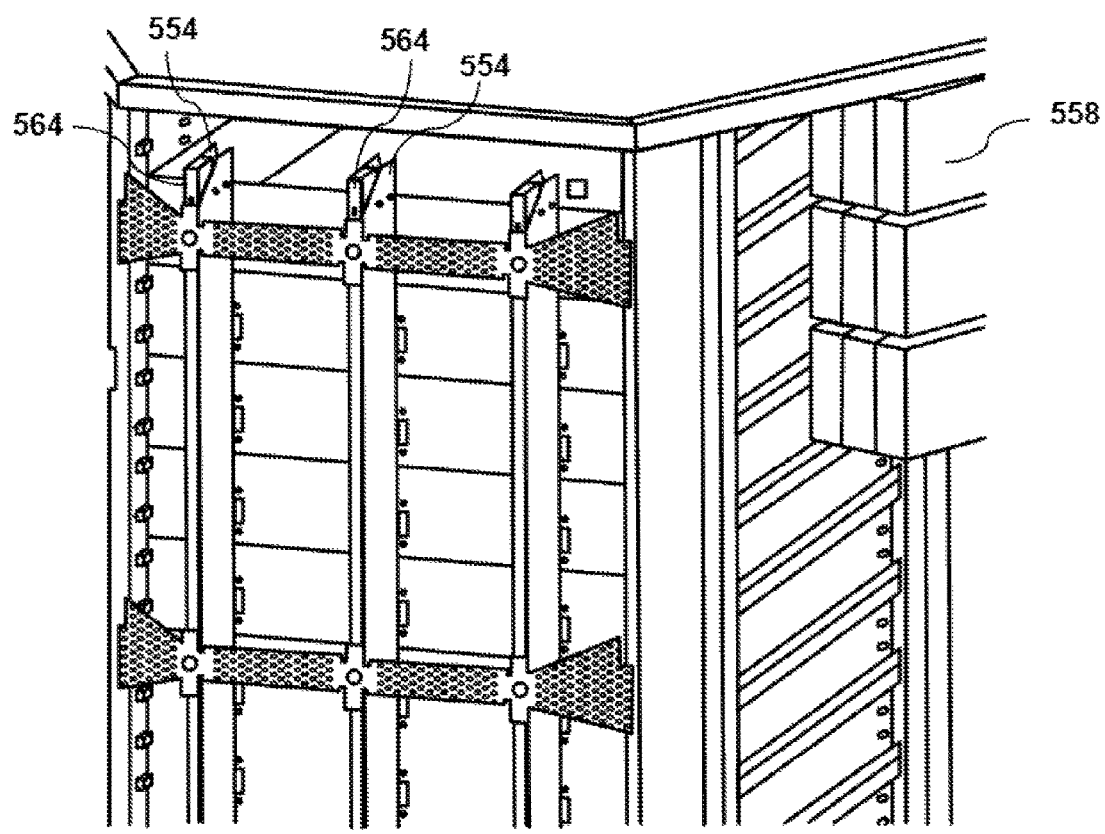
Figure 11:
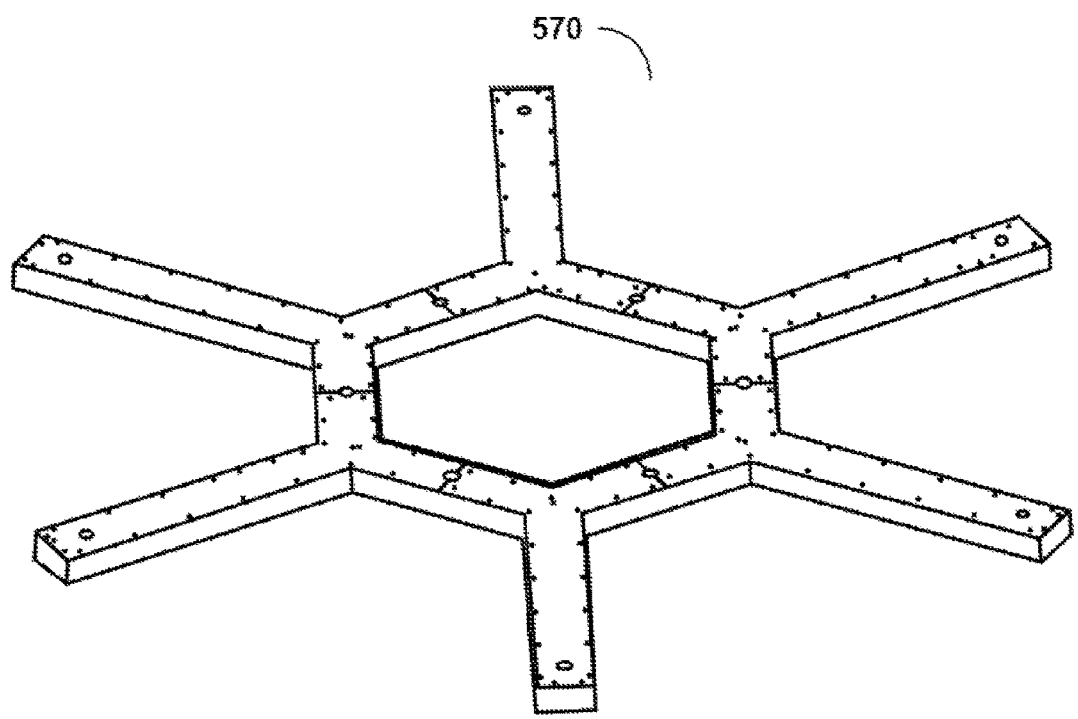
FIG. 11 illustrates a leveling base for the wedge racks of the cylindrical datacenter chamber of FIG. 1, in accordance with some embodiments.

FIGS. 8-10 illustrate examples of components of a wedge rack, in accordance with some embodiments. In some embodiments, wedge rack 536 includes a plurality of structural support elements configured to provide structural support and allow for heavy equipment mounting. For example, FIG. 8 shows rack front supports 550 located proximate an outer face of the wedge rack and extending vertically, rack rear support 552 located proximate to a back side of the wedge rack and extending vertically, and bus bar braces 556 extending horizontally and located proximate to a back side of the wedge rack adjacent the interior chamber coupled approximately perpendicular to rack rear support 552 and rack front support 550. A plurality of bus bars 554 may be disposed along the racks adjacent the interior chamber. Bus bar 554 may be connected to bus braces 556 (e.g., via screws).

The bus bars may be configured to distribute direct current (DC) power to at least some of the computing equipment by conducting electricity (e.g., direct current) within the racks, e.g., delivering power to rack mounted computing devices that establish electrical contact with the bus bars upon being slid into the rack. The bus bars may be in the form of a metallic strip or bar (e.g., copper, brass or aluminum), and the bus bars may be electrically isolated from the chamber chassis. In some embodiments, the bus bars may be of other shapes (e.g., flat strips, solid bars and rods, solid or hollow tubes, and braided wire). Some of these shapes allow heat to dissipate more efficiently due to their high surface area to cross-sectional area ratio. Hollow or flat shapes are prevalent in higher current applications. In some cases, the one or more bus bars may be enclosed in a bus duct. The material composition and cross-sectional size of the bus bar may determine the maximum amount of current that can be safely carried. In some embodiments, the bus bars may have insulators 564, or insulation may surround them in some cases to protect them from accidental contact. In some cases bus bars may be enclosed in a metal housing, in the form of bus duct or busway, segregated-phase bus, or isolated-phase bus.

In some embodiments, chamber 500 may include a plurality of direct current (DC) bus bars for power distribution. Generally, rack-mounted computing equipment consumes DC power. Traditionally, in many cases each instance of equipment received alternative current (AC) power and converted the AC power to DC power with a dedicated power converter. This technique however can be expensive and generate additional heat near the computing equipment. Some embodiments may eliminate the need for the AC power converters by providing DC power. Or in some cases it can be expensive to power an AC voltage input power supply from the DC bus bar. In some embodiments, a bus bar power adapter may allow traditional AC voltage servers to be safely powered, and in some cases, controlled or monitored, via a DC power source.

In some embodiments, datacenter chamber 500 may include a backup power supply. In some cases, chamber 500 may include an integrated power infrastructure. For example, an uninterruptible power supply (UPS) that may be configured to provide uninterrupted power over some duration. In some embodiments, the power supply may be a battery-driven power supply (As shown in FIGS. 9-10 wedge rack 536 may include a rectifier or a battery module 558, such as the power supplies described below with reference to FIGS. 14-16). For example, a higher-voltage direct current (DC) power source, such as a battery may provide electrical power that is converted into a lower voltage, higher current DC power source. In some embodiments, the battery may be based on any of a variety of different chemistries. Examples include lead-acid, nickel-metal hydride, lithium ion, and the like. In some embodiments, other power sources may be used, such as fuel cells, banks of capacitors, and the like. The transformation may be effected by a DC-DC converter, such as a 48-volt to 12-volt DC-DC converter that receives 48 volt DC power at given current and produces 12-volt DC power at a substantially higher current. In some embodiments, the several of the above UPSs may be placed in each rack. In some embodiments, each wedge of a rack may include a separate UPS, e.g., three or more UPSs for each wedge connected in parallel to increase current at a given voltage over that provided by a single UPS. Modular power supplies are expected to limit the scope of damage if any one UPS fails. In some embodiments, the UPS may be controlled remotely.

In some embodiments, datacenter chamber 500 includes a plurality of computing devices disposed in the racks. The computing devices may be disposed on equipment trays 560. In some cases trays 560 may have a plurality of openings on the back of the trays adjacent the inner chamber. The opening may be configured to facilitate connection of the equipment and bus bars. In some embodiments, the openings may include bus bar connectors (example 562 in FIG. 9). The computing devices may have stored thereon operating systems and user-applications (e.g., server applications, databases, load balancers, etc.)

In some embodiments, datacenter chamber 500 may include an integrated compute fabric configured to connect a plurality of computing devices within the chamber. The integrated compute fabric may be configured to connect the computing devices through interconnected nodes and links that look like a "fabric". The nodes may refer to processors, memory, or peripherals and the links may refer to functional connection between nodes. The integrated compute fabric may allow for high processing capabilities.

With some traditional systems, installations are difficult when racks are required to be positioned in relatively precise orientations in order to create a particular geometric shape or to direct airflow. To mitigate this issue, some embodiments use a modular and interlocking leveling base 570 (FIGS. 11-13) framework that serves to both level and to orient the racks into alignment, thus enabling the assembly of complex arrangements of racks with ease. That said, embodiments are not limited to systems that provide these benefits, as various independently useful techniques are described here, which is not to suggest that any other feature may not be omitted in some cases.

Figure 12:
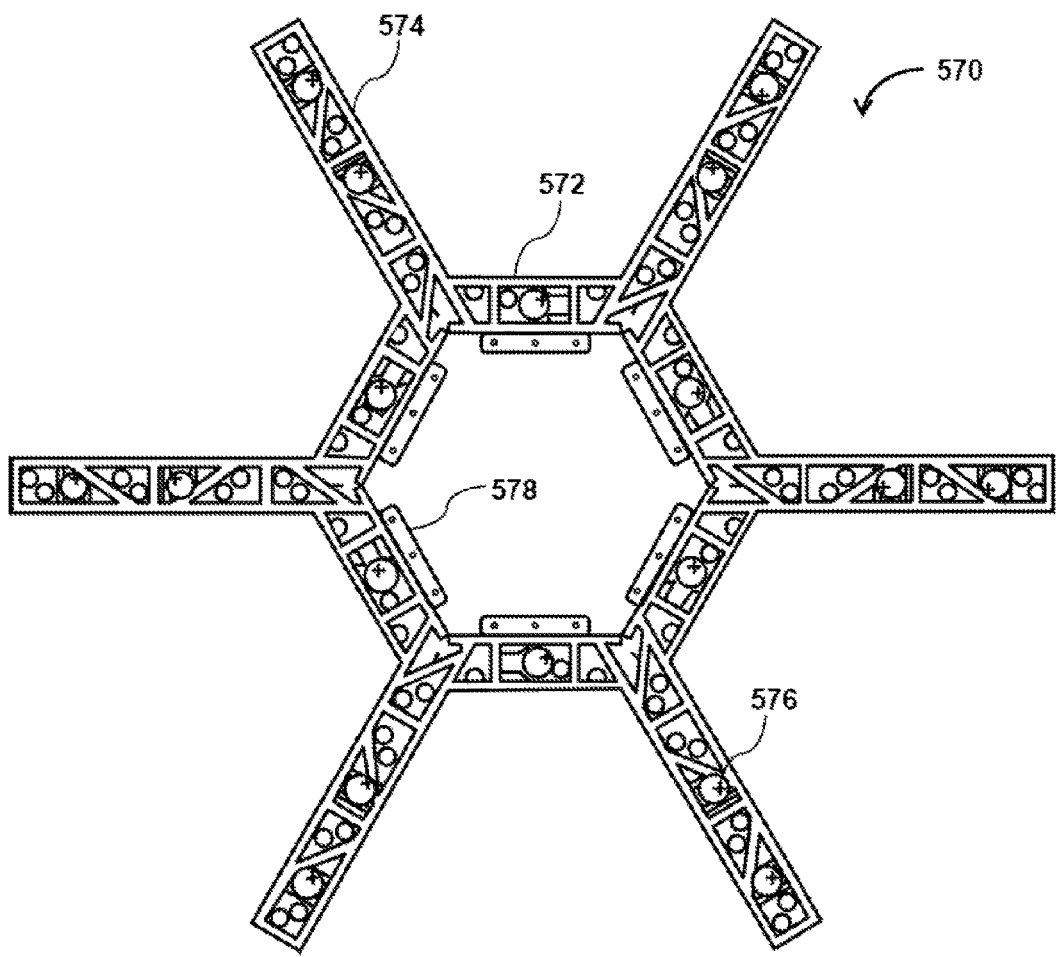
FIG. 12 is a bottom view of the leveling base of FIG. 11, in accordance with some embodiments.

In some embodiments, leveling base 570 includes a center piece 572 and a plurality of horizontally extending arms 574. Center piece 572 may be of hexagonal shape. Or in other cases, the leveling base may of triangular, square, pentagonal, hexagonal, heptagonal, octagonal, decagonal, dodecagonal, or other shapes. In some embodiments the leveling base is of the same shape as the base of chassis (described above). In some embodiments, the leveling base includes a plurality of modular sections configured to be connected together to form the leveling base (e.g., screws, rivets, etc.) This may help in shipping, installation and configuration of the leveling base. In some embodiments, the modular sections may be assembled on-site and then leveled to ensure even weight distribution across the floor. In some embodiments, leveling base 570 may be constructed of aluminum, steel, or a combination thereof to help keep the weight down. The leveling base may be bolted to the floor, using a plurality of bolting plates 578 (as shown in FIG. 12) located in the bottom side of the leveling base, to secure the structure in place to allow for installation and alignment of the racks. The bolting plates may be arranged such that they extend away from the leveling base towards the inner center section of the base.

In some embodiments, the bottom side of the leveling base includes a plurality of adjustable leveling feet 576 configured to level the base and, later when installed, the rest of the chamber. The adjustable leveling feet may be configured to be threaded in the leveling base to allow for adjusting the height of the leveling base and locking for the level of the base. Or other height-adjustable implements may be used, e.g., shims, wedges, hydraulic feet, ratchets, or interchangeable feet of different sizes. In some embodiments, each extending arm may include at least one adjustable leveling foot. In some cases, the leveling base may include a plurality of height-adjustable feet extending from the bottom of the base. In some cases, the height adjustable stands may be bolts threaded into a threaded interface of the base. The bolts extend downward to feet 576, the bolts being adjustable thereby adjusting the height of the feet. In some cases, before the racks are installed, the base may be leveled, so that the weight of the chamber does not interfere with leveling.

Figure 13:
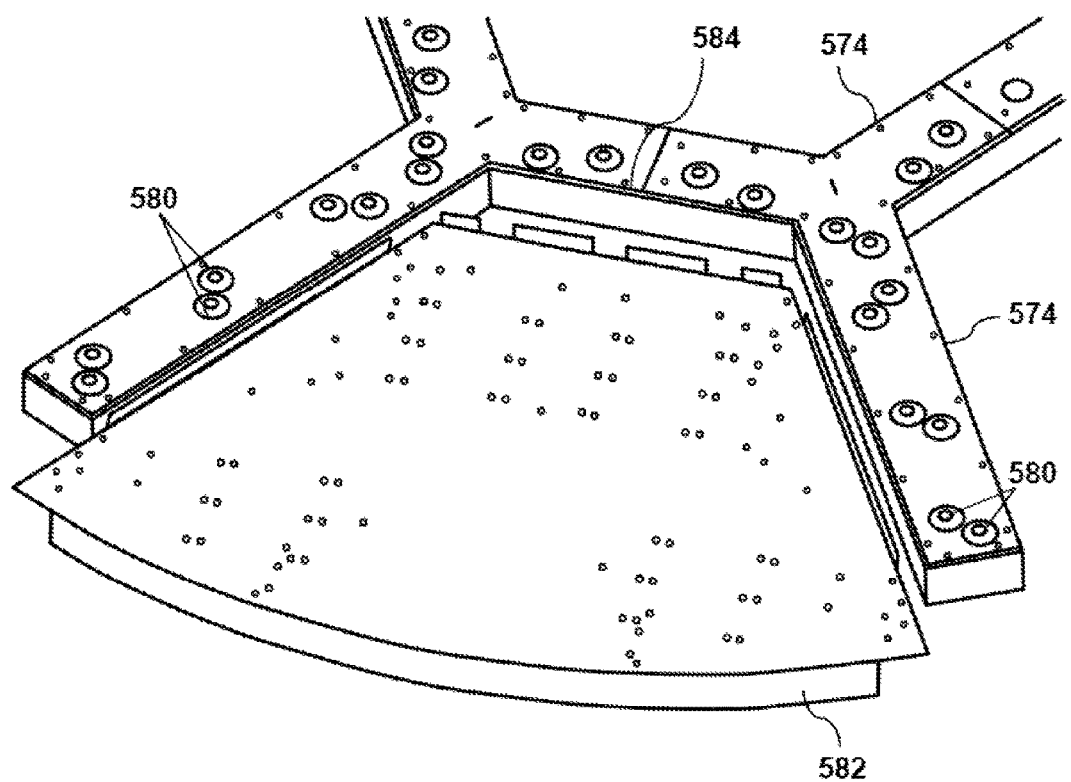
FIG. 13 is a view of a portion of the leveling base of FIG. 11, in accordance with some embodiments.

In some embodiments, as shown in FIG. 13, the upper side of the leveling base includes devices for reducing friction as a wedge-shaped rack is translated over the base. In this example, a plurality of ball bearings 580 located in the extending arms 574 and the center piece 572 of the leveling base 570. The ball bearings are configured to create a guide and support for the racks as they are lifted slightly and slide into place. In some embodiments, the ball bearings 580 include a steel ball seated in a socket. A portion of the ball may extend out of the socket and above the base, with the socket extending into the respective arm, so that less than half of the ball bearing extends above the top surface of the arm. In some cases, each ball bearing has a diameter of between one and three centimeters. In some embodiment, the socket may house a plurality of smaller bearings (e.g., between 2 and 5 millimeters) on which the exposed ball bearing rides to lower friction. Examples include an SP-30 ball transfer unit available from Ahcell of Taizhou, Jiangsu Province in China. In some embodiments, each extending arm may include eight ball bearings configured such that four ball bearings guide and support one bottom side of a rack and the other four ball bearings on the same arm are configured to guide and support one bottom side of an adjacent rack.

During installation of a wedge-rack, the wedge-rack may be translated (e.g., slid, rolled or carried) horizontally toward the interior chamber, between the respective arms receiving the unit. As the rack makes contact with the distal portion of the ball bearings extending upward from the arms, the bottom of the rack 582 may be lifted (in some cases by being slid against and up onto the ball bearings) and rolled on top of the ball bearing located on the arms located on each side of the bottom of the rack. Once on the ball bearing the bottom of the rack is pushed (with relatively little effort) such that the back side 584 of the bottom of the rack is on top of the ball bearing located on the center piece of the leveling base. As the rack is pushed backward a first force is generated translating the rack slightly upward, as the rack rolls onto the ball bearings. Then, as the rack rolls over the ball bearings, the rack may translate downward to sit on the leveling base, e.g., the bottom of the rack may include an indent to receive each ball bearings when in the proper position, thereby providing haptic feedback indicative of proper alignment.

Once in place, the bottom of the rack may be secured using an electronic latch, or a manual latch (e.g., a peg in a hole). In some embodiments, once the rack is in place a signal indicating that the rack is properly seated on the leveling arm may be generated (e.g., audible signal, visual signal, or other forms of signals). In some embodiments, a gasket sealer may be used to seal the racks side by side and to seal the back side of the rack to the chassis.

Alternatively or additionally, the leveling base may include air-casters configured to secure each of the racks to the leveling base. In some embodiments, air-casters may be created in the assembled leveling base such that they coincide with mating structures on the bottom side of the rack. The air-casters create a guide for the racks as they are lifted slightly and slid into place. Once in position, the rack is lowered onto the base and settles into the air-casters, which is expected to help with proper alignment. In some embodiments, other structures may reduce friction, e.g., Teflon™ bushings, bearings on the bottom of the rack, wheels on the top of the base or bottom of the rack, etc.

In some embodiments, the above-described rack-mounted computer assemblies may include a backup power supply, such as an uninterruptible power supply (UPS) described below with reference to FIGS. 14-16. In some embodiments, the power supply may be a battery-driven power supply, like that depicted. Many existing backup power supplies are relatively large when configured for relatively short durations of power provision (e.g., less than ten minutes, such as less than or approximately equal to five minutes) at relatively high current (e.g., more than 250 amperes, such as more than or approximately equal to 750 amperes) of electrical power.

To mitigate these issues, and others, some embodiments include the depicted UPS (a term which does not imply that power is never interrupted, merely that over some duration, power remains uninterrupted). In some embodiments, a higher-voltage direct current (DC) power source, such as a battery may provide electrical power that is converted into a lower voltage, higher current DC power source. Higher voltages in the battery, in some embodiments, are leveraged to generate larger currents than would otherwise be available for a battery of a given size. This technique is expected to accommodate use of relatively small batteries while delivering relatively large currents for relatively short durations.

In some embodiments, the battery may be based on any of a variety of different chemistries. Examples include lead-acid, nickel-metal hydride, lithium ion, and the like. In some embodiments, other power sources may be used, such as fuel cells, banks of capacitors, and the like.

The transformation may be effected by a DC-DC converter, such as a 48-volt to 12-volt DC-DC converter that receives 48 volt DC power at a given current and produces 12-volt DC power at a substantially higher current. In some embodiments, the converter may be a switched-mode converter. In some embodiments, the converter may include a metal-oxide semiconductor field effect transistor coupled to an oscillator that periodically reverses polarity of the higher-voltage input DC power supply. In some embodiments, the converter may be a magnetic converter that includes an inverter that converts 48-volt DC current to alternative (AC) current, a transformer that steps down the voltage of the AC current, and a rectifier that converts the stepped-down AC current to a DC current. The converter may include a low-pass filter (e.g., a parallel-connected capacitor and serially connected resistor) that smooths voltage changes in the DC current at the lower voltage.

In some embodiments, the power-conversion circuitry may generate a relatively large amount of heat. To dissipate this heat, circuitry may be mounted to a thermally conductive substrate, such as an aluminum circuit board having thereon a heat sink. Some embodiments may include components driving forced convection, such as fans, and baffles to direct waste heat.

In some embodiments, several of the above UPSs may be placed in each rack. In some embodiments, each wedge of a rack may include a separate UPS, e.g., three or more UPSs for each wedge connected in parallel to increase current at a given voltage over that provided by a single UPS. Modular power supplies are expected to limit the scope of damage if any one UPS fails.

In some embodiments, the UPS may include sensors and control circuitry accessible via the power-line communication protocols described in the applications incorporated by reference. For instance, in some embodiments, temperature may be sensed, diagnostic tests may be performed, and the UPS may be engaged or disengaged remotely.

Figure 14:
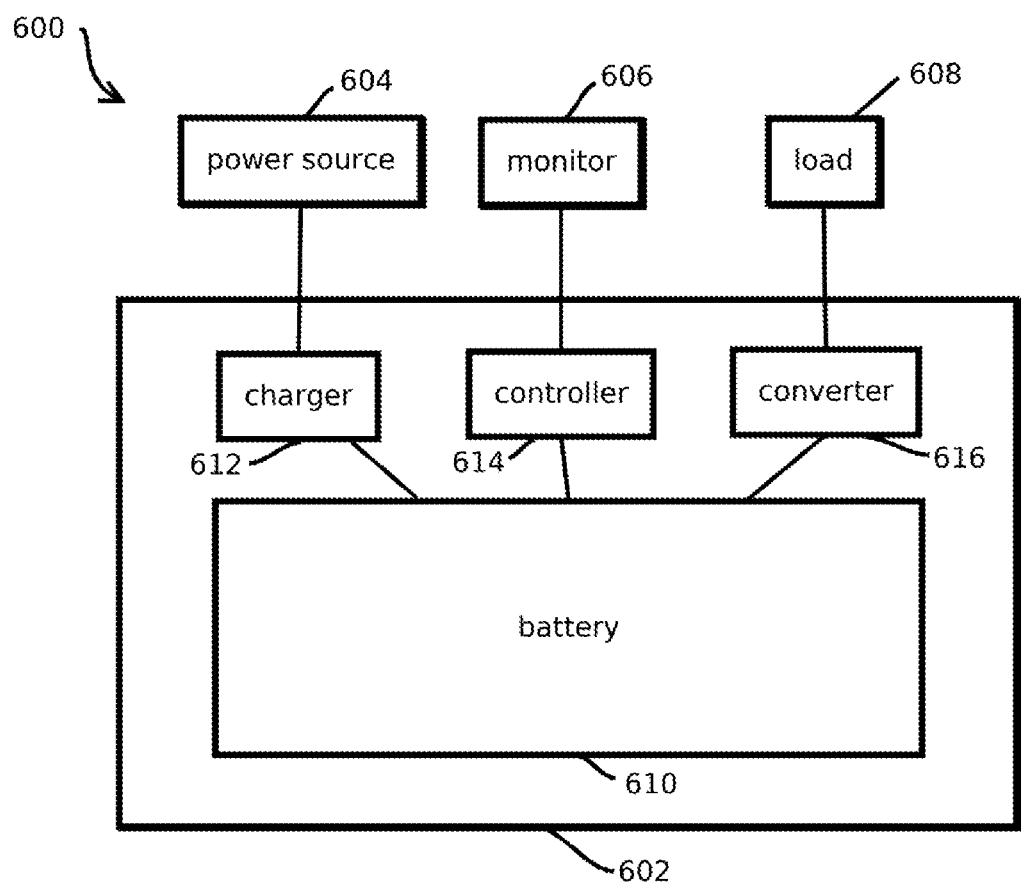
FIG. 14 is a block diagram of an example of an uninterruptible power supply, in accordance with some embodiments.

For example, FIG. 14 illustrates a computing environment 600 having an example of a power supply 602 that may mitigate some of the above-described issues with traditional power supplies, as well as, or in the alternative, provide other benefits described below. In some embodiments, the power supply 602 is a UPS configured to operate in a computing environment, for example, as one of several power supplies disposed within (or adjacent, dedicated to, or coupled to) a rack of computing equipment, such as one or more of the above-described racks (or collections of racks, like a chamber). In some cases, each wedge of the above-described racks may include one or more of the power supply 602, for instance, three, six, or more power supplies per wedge.

In some embodiments, the computing environment 600 includes the power supply 602, a power source 604, a monitor 606, and a load 608. In some embodiments, the power source 604 may be electrically connected to the power supply 602 and the load 608 to charge the power supply 602 and supply power to the load 608. In some embodiments, the monitor 606 may be connected, for instance, via a local area network, to the power supply 602. The load 608, which may be one or more of the above-described computing devices mounted in racks, may be connected by power cables to both the power supply 602 and the power source 604.

In operation, the power source 604 may power the load, for instance, with alternating current or direct current electrical power, and the power supply 602 may be energized, for instance, by charging a battery, from the power source 604. In some instances, the power source 604 may cease providing power to the load 608, for instance, in the event of a power outage or equipment failure, and the power supply 602 may continue providing electrical power to load 608, for instance, electrical power having properties similar to that provided by the power source 604 during operation. In some cases, the monitor 606 may direct the operation of the power supply 602 and monitor various sensors of the power supply 602, for instance, monitoring a charge state of a battery, usage of the battery, or a temperature of the power supply. In some cases, the monitor 606 is a rack controller as described in the patent applications incorporated by reference. In some cases, the battery may be a multi-cell battery, and each cell may be accompanied by sensors of these parameters, and the cells may be monitored and tracked independently.

In some cases, the load 608 is one or more of the above-described rack-mounted computers, which may execute various applications in the context of an operating system. In some embodiments, the loads 608 may include processors and memory storing instructions that when executed effectuate various applications, such as components of web applications that serve relatively large numbers of remote user computing devices. In some embodiments, the loads 608 may be relatively sensitive to variations in the power supply, for instance, being configured to draw computer-grade electrical DC power. In some cases, the load 608 is configured to receive and operate upon DC power and does not include an alternating current (AC)-to-DC power converter. In some case, the load 608 may be configured to directly receive DC power, for instance 12 V DC power, in some cases at a rate of greater than 250 A, for instance above 500 A, and in many cases approximately equal to 750 A, e.g., within 10% of 750 A.

In some embodiments, the power supply 602 includes a battery 610, a charger 612, a controller 614, and a converter 616. Some embodiments may include multiple instances of each of these components, such as redundant batteries, chargers, controllers, and converters, which is not to imply that other features are limited to the number depicted. In some embodiments, the controller 614 may be operative to sense a failure of one component, disengage that component, and engage another instance of the component to provide enhanced redundancy, though not all embodiments afford this benefit.

In some embodiments, the battery 610 may be a relatively small battery by volume, thereby consuming relatively small amounts of valuable space in a data center. In some embodiments, the battery 610 is smaller than one cubic foot, for instance, less than one half of one cubic foot, and in many cases, smaller than one quarter of one cubic foot. The battery may include one cell or multiple cells. In some embodiments, the battery may be based on various chemistries, examples of which are described above. In some embodiments, the battery 610 may include a plurality of electrodes and an electrolyte. In some embodiments, the battery may include integrated sensors and a battery monitoring microcontroller. In some cases, the battery includes a thermocouple to sense temperature and a Coulomb counter outputting a signal that may be integrated to determine energy storage and consumption. In some cases, the battery may output such data via an I2C standard output. In some cases, the battery may include over-current (OC), over-voltage (OV), short-circuit discharge (SCD), and under-voltage (UV) protection circuits and logic operative to monitor the state of these circuits and report, via the controller, instances in which such circuits are engaged.

In some embodiments, the battery may be configured to output electrical power with certain properties. In some embodiments, the battery is configured to output electrical power in the form of direct current at greater than 12 V potential, for instance, greater than 24 V of electrical potential, and in many cases approximately equal to 48 V of electrical potential, e.g., within 10% of that value. The battery may be designated as configured to output electrical power having certain properties as a result of the battery exhibiting those properties when fully charged, and the battery is so configured even in an uncharged state provided the capability when properly charged is present. In some cases, the battery may be designated as having those properties as a result of complying with various industry standards qualifying the battery as having those properties. In some embodiments, multiple battery cells may be connected to one another, for instance in series, to constitute a single battery collectively having the desired electrical properties. In some embodiments, the battery may be supplemented or replaced with various other energy storage devices, such as capacitor banks, fuel cells, flywheels, and the like.

In some embodiments, the battery may output a current substantially lower than that provided to the load 608, at a voltage substantially higher than that provided to load 608. In some cases, the output current may be substantially less than 750 A, for instance, approximately equal to 190 A, and in some cases less than 300 or less than 500 A. In some cases, the battery 610 may output direct-current electrical power at approximately one half or one quarter of the current provided to load 608, in some cases at a voltage that is twice or four times the voltage with which electrical power is supplied to the load 608.

In some embodiments, the charger 612 may be disposed between the power source 604 and the battery 610. In some cases, the charger 612 is configured to charge the battery 610 while the power source is operative, such that the battery can deliver power to the load when the power source is inoperative. In some embodiments, the charger 612 may be configured to provide a floating charge to the battery 610, such that power is trickled into the battery concurrent with a small amount of power being drained from the battery to keep other circuits, such as in the converter 616 in a more responsive state following transient events.

In some embodiments, the power source 604 is an alternating current power source, and the charger 612 may include circuitry configured to transform the form of the power. In some cases, the charger 612 may include a transformer, a rectifier, and a low-pass filter operative to convert alternating current power into direct current power suitable for use by the battery 610. In some cases, some of the components described below of the converter 616 may be shared by the charger 612 to lower the cost of the power supply 602, though not all embodiments provide this benefit, as various other independently useful features are described. For example, a switching regulator may be shared between the charger and the converter, examples of which are described in greater detail below.

In some embodiments, the charger 612 is a battery charger having an alternating current voltage detector. In some cases, the battery charger may be operative to receive either DC or AC electrical power and route the incoming electrical power to an appropriate power conversion circuit to charge the battery, thereby permitting a single power supply to be used in multiple environments. In some cases, the alternating current voltage detection circuit may include two half bridge rectifiers each outputting to two separate low-pass filters that output to two control gates of transistors that collectively form a gate, such that alternating current power results in a output signal of logic one when alternating current is present and logic zero when not. The output of the circuit may then route the incoming electrical power to the appropriate charger power conditioning circuitry.

In some embodiments, the controller 614 may be coupled to the battery and the monitor 606 and may control the operation of the battery and interface with remote monitoring equipment. In some cases, the controller 614 includes a microcontroller configured to poll (e.g., periodically) various sensors associated with the battery, like a temperature sensor, a voltage sensor, a current sensor, a charge sensor, and the like, or some embodiments may include an interrupt handler operative to select and execute routines in response to interrupts pushed by the components. In some cases, the controller 614 is connected to the charger 612 and the converter 616 and controls logic of these components. For instance, the controller 614 may respond to the alternating current voltage detection circuitry described above to engage various components of the charger 612 appropriate to the operating environment.

In some cases, the controller 614 is configured to compare incoming signals to thresholds and to take various responsive actions. For example, the controller 614 may be operative to receive a temperature sensor signal of one cell of a battery (or the full battery), compare the signal to a threshold, and disengage the charger 612 or the converter 616 in response to the temperature exceeding a threshold. In some cases, the controller 614 is configured to log and report signals from the battery indicative of the above-described protection circuitry being engaged and in some cases, disable one or more cells in response. In another example, the controller 614 may monitor a charge state of the battery 616, such as an amount of energy stored by the battery 610 as reported based on signals from a Coulomb counter sensor, compare the amount of energy stored to a threshold, and engage the charger 612 in response to determining that the charge has dropped below a threshold level.

In some cases, the controller 614 is configured to monitor the status and health of the battery, for instance, by integrating a measure of battery usage. In some cases, the measure of battery usage may be a number of charge and discharge cycles of the battery. In some embodiments, the controller 614 may maintain this count in a remotely readable register or may report this amount periodically to the monitor 606, e.g., via the above-noted power-line communication systems. In some cases, the controller 614 is configured to measure battery usage with other techniques that account for uneven battery wear in deeper cycles, as often a battery will be partially discharged without being fully discharged, and often the amount of discharge disproportionately affects wear on the battery 610. For example, in some cases, the controller 614 may periodically poll the battery 610 for a signal indicative of an amount of energy stored by the battery, and in some embodiments may determine an amount of change in energy storage between peaks and valleys of the signal. In some cases, the difference between the peaks and valleys may be input to a function that outputs a score indicative of an amount of wear on the battery, such as a function in which the score increases nonlinearly as the difference between the peak and the valley increases, for instance, a function with an increasing magnitude of a derivative of peak to valley versus score, e.g., of a form proportionate to $y=x/(1-x)$ where x represents the cycle depth and y represents the wear score.

In some cases, the controller 614 may be configured to interface with a remote monitor 606, such as the examples of the OpenDCRE system described in the applications incorporated by reference. In some cases, the battery may report an amount of energy stored by the battery, an amount of wear on the battery, a temperature of the battery, engagement of protection circuits, and a state of the power supply, like charging, charged, discharging, disabled, testing, and the like. In some cases, the controller 614 may be configured to execute various test routines, for instance, by which a charged battery is tested by driving a current to ground via for example a test load, like a resistor, to periodically confirm that the power supply is operating, e.g., by comparing a voltage drop across the test load against a threshold voltage. In some embodiments, the controller 614 is configured to report the result of these test routines to the monitor 606.

In some cases, the controller 614 may coordinate the operation of multiple power supplies, such as multiple power supplies in a rack, like redundant power supplies. In some embodiments, either at the direction of the monitor 606 or based on signals exchange between controllers operating redundantly, test routines may be coordinated, such that one power supply 602 receives a signal from another power supply indicating that the other power supply is engaging in a test routine or is otherwise operative, and the receiving power supply may respond by preventing test routines until the status of the other power supply changes.

In some embodiments, the power supply 602 includes a converter 616, features of which are described below with reference to FIG. 15. In some embodiments, the converter 616 is connected electrically between the battery 610 and the load 608 (e.g., connected via a closed circuit or via an open, switchable circuit). In some embodiments, the converter 616 inputs DC power from the battery 610, for instance, at a first voltage and current, and outputs DC power to the load 608 at a different voltage and current, such as a substantially lower voltage and substantially higher current, examples of which are described above. In some cases, the converter is a 48 V to 12 V DC to DC converter, such as a switch mode converter.

In some embodiments, the power supply 602 may be an uninterruptible power supply, such as a modular power supply, configured to fit within a rack housing rack-mounted computing equipment, examples of which are described above. In some cases, the components of the power supply 602 may be disposed within a case, like a box having electromagnetic shielding and venting, such as a steel or otherwise conductive box. In some cases, the case may include apertures to vent heat generated by the components therein and, in some cases, some of the components therein may include various heat dissipation devices, like heatsinks, peltier coolers, and fans.

In some cases, the power supply 602 is configured to interface with bus bars of a computing equipment rack, like those described above with reference to FIG. 10. In some cases, the rack may include three pairs of bus bars, each bus bar pair including two generally conductive straight rods (e.g., copper rods) extending in parallel in fixed relation (e.g., substantially so), such as within an inch of each other or less for each pair vertically along the back of a rack, and in some cases, each pair being more than four inches apart. In some cases, each of the 6 rods may be positioned in a generally parallel vertical plane at the back of a rack, such that rack computing equipment slid backwards into the rack may make electrical contact with the rods along the length of the rods (connecting the computer equipment to power concurrent with the equipment being posited in the rack in the same movement), and multiple computing devices may draw power from one or more of the pairs of bus bars.

In some cases, the power supply 602 may include one or more pairs of electrically conductive insulated cables extending from the power supply 602 and making contact with one of the pairs of bus bars, such as AWS gauge 22 or smaller gauge cables. For example, in some cases, electrical cabling may include distal end with a generally flat plate with a generally circular hole (like a washer welded to the cable), and the bus bars may include a similar hole. In some cases, a bolt may be passed through the hole of the bus bar and the plate at the end of the cable, and a threaded nut may secure the cable to a respective one of the bus bar conductors. In some cases, the power supply 602 includes three pairs of such cables extending to each of the three bus bars, or some embodiments may include fewer bus bars or different power distribution topologies.

In some cases, multiple power supplies 602 may be positioned and coupled to each rack or chamber described above. Having multiple power supplies, particularly modular power supplies, is expected to facilitate relatively modular configuration of the computing equipment, such that the cost of excess backup power supplies need not be incurred when racks are partially filled. Further, modular racks and chambers are expected to simplify and reduce the cost of adjusting the amount of computing power on hand. Having power supplies associated with the rack, is expected to afford various benefits relative to systems that include a single data center wide backup power supply (though embodiments are also consistent with that topology), for similar reasons related to benefits afforded by modularity. Modular power supplies are also expected to afford higher reliability relative to monolithic systems, as redundant backup power supplies may be disposed on the rack, such that one power supply may be serviced while the other continues to provide backup power, or one backup power supply may undergo a test routine while the other is ready to respond to a power outage. In some cases, each backup power supply 602 may supply power to a plurality of computing devices, such as to a plurality of servers via a plurality of respective motherboards. Having the backup power supply shared among multiple servers is expected to be less challenging to manage and less expensive than having a backup power supply for each server, and in some cases, the backup power supply 602 is positioned away from the servers, for instance, separated by electromagnetic shielding materials, like conductive plates, such that potentially relatively powerful electromagnetic noise generated by the charger 612 or converter 616 are less likely to induce material currents in sensitive electronic components on the motherboards. That said, various independently useful inventions are described, and some embodiments may not provide all of these benefits.

Figure 15:
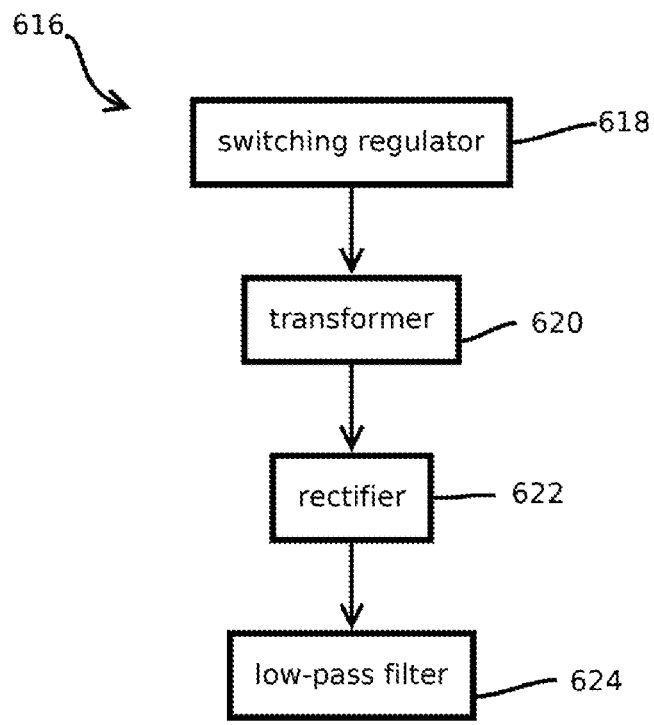
FIG. 15 is a block diagram of a power converter of the power supply of FIG. 14.

FIG. 15 illustrates an example of components of the converter 616. In some embodiments, the components are operative to convert DC power at a first voltage and current to DC power at a different voltage and current, such as a substantially lower voltage and substantially higher current.

In some cases, the power converter 616 includes a switching regulator 618 configured to receive DC electrical power from the battery 610 and convert the DC electrical power to AC electrical power. In some cases, the switching regulator 618 includes a pair of field effect transistors each coupled to a respective pole of the battery, and each of the field effect transistors may include a control gate inversely (relative to one another) coupled to a timing circuit, such as a clock, such that one field effect transistor is in a substantially open state, while the other field effect transistors in a substantially closed state, and vice versa. In some cases, the switching regulator 618 may output a square wave alternating current. In some embodiments, the frequency of the alternating current may be relatively high, such that other components may be designed to be substantially smaller and less expensive to achieve the desired power conversion relative to systems available for lower frequency alternating current, though embodiments are consistent with those lower frequency systems as well. In some cases, the switching regulator may output alternating current power as higher than 300 Hz, for example at higher than 100 kHz.

In some embodiments, the AC power may be received by a transformer 620 having an inductor by which power is converted, such as a transformer having a primary coil, a ferromagnetic core, and a secondary coil connected to the primary coil by a flux circuit formed by the core. In some cases, the primary coil, when receiving the AC power, may induce a time varying electromagnetic flux in the core, which may induce a time varying, or alternating, current in the secondary coil. In some cases, the ratio of turns in the primary coil to the number of turns in the secondary coil may be selected based on a desired amount of transformation between voltage and current. For instance, in some cases, the transformer may have a turn ratio of greater than 2 to 1, such as around 4 to 1. In some cases, operating at relatively high frequencies, may accommodate smaller cores for the transformer, which are often among the heavier components of a power supply, relative to systems that operate at lower frequencies.

In some cases, the alternating current power output by the transformer may be received by rectifier 622, which may invert voltages less than some threshold, such as ground. In some cases, the rectifier 622 is a Wheatstone bridge rectifier. In some embodiments, the output of the rectifier may be output to a low-pass filter 624. In some embodiments, the low-pass filter 622 includes a capacitor disposed in parallel with the rectifier between two output leads of the rectifier 622. In some embodiments, the low-pass filter includes an inductor coupled in series with the rectifier 622. In some embodiments, the low-pass filter includes one or more resistors configured to dampen oscillations of the low-pass filter 624. In some embodiments, the output of a low-pass filter 622 may be coupled to a voltage sensor and a current sensor connected to the controller 614, as well as a pair or multiple pairs of electrical conductors, such as cables, configured to be secured to (or otherwise interface with) the rails of a set of bus bars on the back of a rack.

Figure 16:
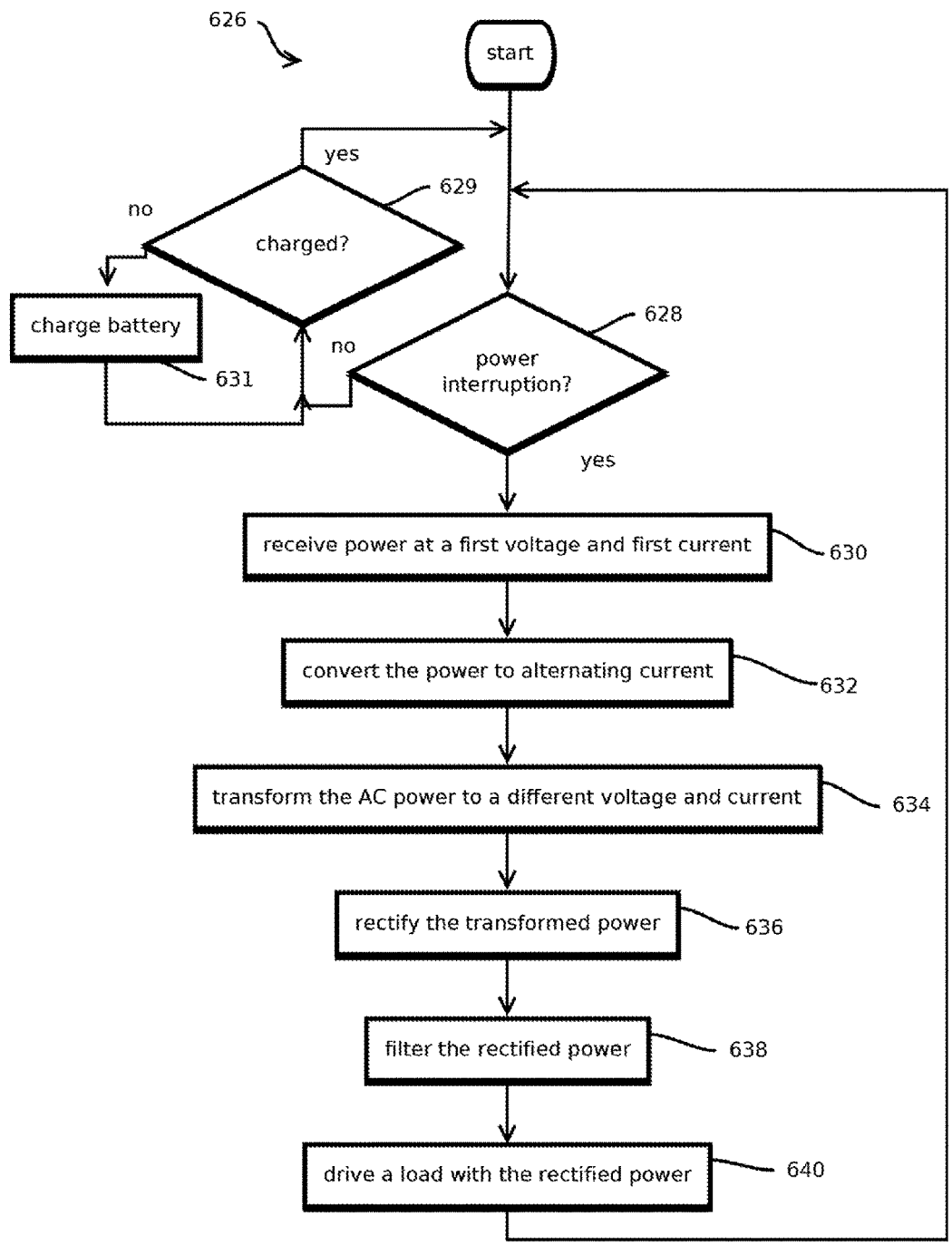
FIG. 16 is a flowchart of a process performed by the power supply of FIG. 14.

FIG. 16 illustrates an example of a process 626 that may be performed by some embodiments of the above-described power supply 602. In some embodiments, the process 626 includes determining whether power has been interrupted, as indicated by block 628. In some cases, this determination may be made by the controller 614 or the monitor 606. Upon determining that power is not interrupted, some embodiments may determine whether the battery is charged, as indicated by block 629. If the battery is not charged, some embodiments may charge the battery, as indicated by block 631 and then return to the determination of block 628, which in some cases may be performed concurrently with charging (which is not to imply that other operations may not also be concurrent or performed in a different order from that described).

Upon determining that power has been interrupted, some embodiments may receive power at a first voltage and first current, such as from a battery, as indicated by block 630. In some cases, DC power may be received from a variety of other sources, such as a flywheel, a capacitor or capacitor bank, or a fuel-cell. In some cases, the received power is DC power provided according to the outputs of the above-describe battery 610 of FIG. 14.

Next, some embodiments may convert the power to alternating current, as indicated by block 632, for instance, with the above-described switching regulator 618 of FIG. 15. Next, some embodiments may transform the AC power to a different voltage and current, as indicated by block 634, for instance, with the above-described transformer 620. Next, some embodiments may rectify the transformed power, as indicated by block 636, for instance, with the above-described rectifier 622. Some embodiments may then filter the rectified power, as indicated by block 638, for instance, with the above-described low-pass filter 624 of FIG. 15. Some embodiments may then drive a load with the rectified power, as indicated by block 640. In some embodiments, the load may be driven for some duration of time before a secondary backup power supply, such as one powered by diesel generator is engaged. In some cases, the amount of time the load is driven may be relatively short, such as less than one minute, less than 10 minutes, or less than 30 minutes.

In some embodiments, the above-described controller 614 of FIG. 14 may perform various routines to smooth the transition between a primary power source and the backup power, potentially mitigating the magnitude of dips in electrical power during such a transition. In some embodiments, the controller 614 may float charge the battery 610 with the charger 612 while directing a small amount, such as less than 10%, of the output capacity of the battery 610 to a dummy load or the primary load 608, thereby reducing transient effects when transitioning between the primary source of power and a backup source of power (though not all embodiments afford this benefit). In some embodiments, the power supply 602 may include various capacitors disposed between the battery 610 and the load 608 (e.g., between power lines and ground) that may remain charged and may supply electrical power while transitioning between the primary power source and the backup power support. In some embodiments, the standby activities may consume electrical power, so some embodiments may disengage the standby activities in response to receiving a signal, such as from the monitor 606, indicating that computing equipment backed up by the power supply 602 is not in use, for instance, when servers are undergoing maintenance or are not being operated due to lower than peak demand.

The power supply 602 has been described as being coupled to rack-mounted computing equipment, but it should be emphasized that the present techniques have uses in a variety of other contexts, such as backup power supplies for medical equipment, cellular towers, manufacturing processes, and the like.

Figure 17:
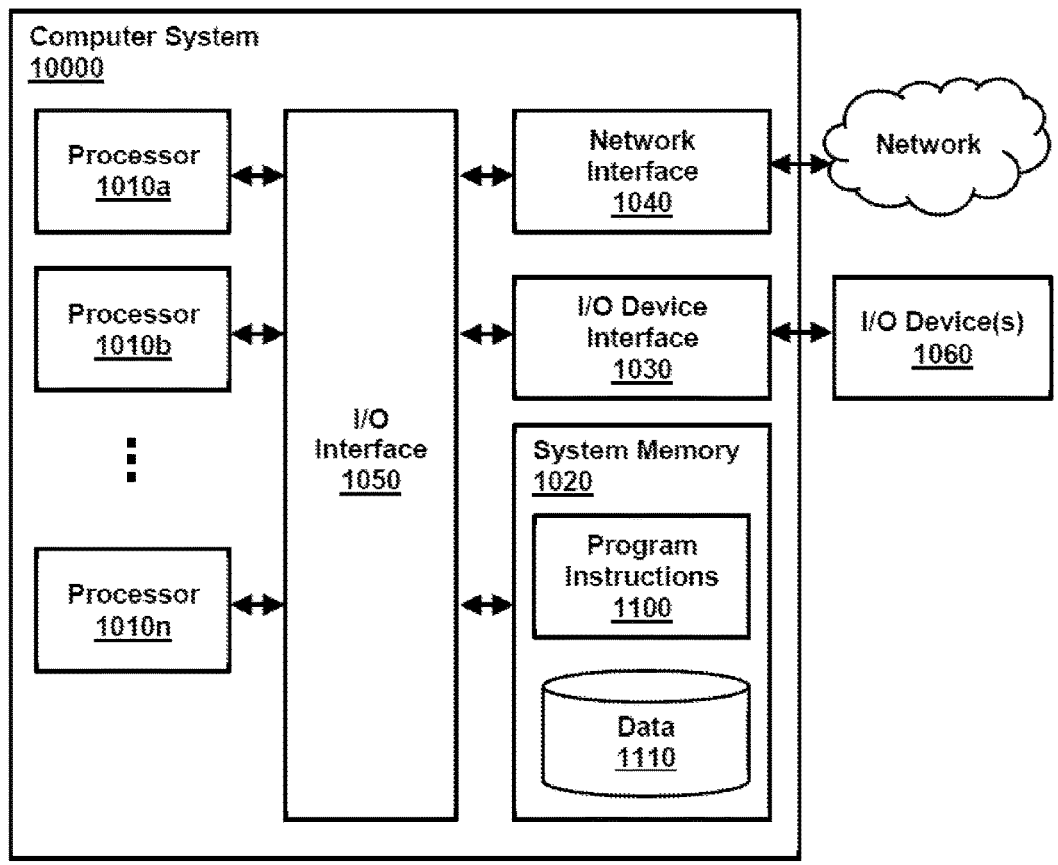
FIG. 17 illustrates components of a computing device that may be disposed and interconnected in the cylindrical datacenter chamber of FIG. 1.

FIG. 17 is a diagram that illustrates an exemplary computing system 1000 in accordance with embodiments of the present technique. In some cases, each U in each rack of the above-described chamber may house one or more of these systems 1000. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors $1010a$-$1010n$) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor $1010a$), or a multi-processor system including any number of suitable processors (e.g., $1010a$-$1010n$). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices).

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. A device, comprising: a power supply comprising: a battery configured to output direct current (DC) power at a first voltage and a first current; a battery charger coupled to the battery and configured to charge the battery; a power-converter configured to receive DC power from the battery and convert the DC power to output DC power at a second voltage and a second current, the second voltage being less than half the first voltage and the second current being greater than twice the first current; and an interface to couple output power from the power-converter to a bus-bar power interface of a rack configured to hold computing equipment.

2. The device of embodiment 1, wherein: the battery is configured to output 48 volt DC power; the second voltage is 12 Volts; the second current is greater than 700 milliampheres; a plurality of computers are coupled to the power supply via the busbar, wherein the busbar extends vertically along a rear portion of a rack holding the plurality of computers; the battery charger is configured to float charge the battery; the power-converter comprises: a switching regulator comprising: a plurality of field effect transistors; and a clock coupled to control gates of the field effect transistors; a transformer configured to transform an alternating current output of the switching regulator from one voltage and current to another voltage and current; a rectifier coupled to an output of the transformer; and a low-pass filter coupled to the output of the rectifier and operative to output power at the second current and the second voltage.

3. The device of any of embodiments 1-2, wherein the battery comprises: a battery configured to output 48 volt DC power and occupying less than one cubic foot of volume.

4. The device of any of embodiments 1-3, wherein power-converter comprises: a switched-mode DC-to-DC power converter.

5. The device of any of embodiments 1-4, wherein the power-converter comprises a switching regulator comprising a plurality of field effect transistors.

6. The device of any of embodiments 1-5, wherein the power-converter is configured to convert incoming DC power to AC power at a frequency higher than 300 Hertz.

7. The device of any of embodiments 1-6, wherein the power-converter comprises means for converting DC power.

8. The device of any of embodiments 1-7, wherein the interface comprises: a pair of insulated electrical cables each having a plate at a distal end configured to be secured to a respective rail of a busbar by a respective bolt.

9. The device of any of embodiments 1-8, wherein the interface comprises: three pairs of insulated electrical cables configured to couple to three parallel sets of busbars extending in parallel along a back of a rack.

10. The device of any of embodiments 1-9, wherein the interface comprises: means for interfacing to a busbar of a server rack.

11. The device of any of embodiments 1-10, wherein: the first voltage is approximately four times the second voltage; the first current is approximately one fourth the second current; the battery occupies less than 0.5 cubic feet of volume; and the second current is greater than 500 milliamps.

12. The device of any of embodiments 1-11, comprising: a controller having: a communications interface; a microprocessor coupled to the network interface and one or more sensors of the power supply; and memory storing instructions that when executed by the microprocessor effectuate operations comprising: monitoring a state of the power supply.

13. The device of embodiment 12, wherein the operations comprise: monitoring parameter of the battery; and comparing the parameter to a threshold.

14. The device of embodiment 13, wherein the parameter is a temperature.

15. The device of any of embodiments 13-14, wherein the parameter is a value indicative of an amount of energy stored by the battery.

16. The device of any of embodiments 12-14, wherein the operations comprise: steps for monitoring a state of the power supply.

17. The device of any of embodiments 12-16, wherein the operations comprise: receiving a signal indicating that computing equipment coupled to the power supply is not in use; and in response to the signal, transitioning the power supply from a first mode of operation to a second mode of operation, the second mode of operation consuming less power than the first mode of operations.

18. The device of any of embodiments 1-17, comprising: a rack configured to hold computing equipment and having a busbar coupled to the interface.

19. The device of embodiment 18, comprising: a plurality of computing devices held by the rack and coupled to the busbar.

20. The device of embodiment 19, wherein: the plurality of computing devices comprise memory storing instructions that when executed cause the computing devices to provide content for a web application.

What is claimed is:
1. A device, comprising:
a modular power supply unit comprising:
    a battery configured to output direct current (DC) power at a first voltage and a first current;
    a battery charger coupled to the battery and configured to charge the battery;
    a power-converter configured to receive DC power from the battery and convert the DC power to output DC power at a second voltage and a second current, the second voltage being less than half the first voltage and the second current being greater than twice the first current; and
    an interface to couple output power from the power-converter to a bus-bar power interface of a rack configured to hold computing equipment configured to receive input power at the second voltage;
wherein the bus-bar power interface provides an output voltage via bus-bars to rack-mounted computing equipment at substantially the second voltage without any intervening voltage conversion between the interface of the power supply and the rack-mounted computing equipment.

2. The device of claim 1, wherein:
the battery is configured to output 48 volt DC power;
the second voltage is 12 Volts;
the second current is greater than 700 milliampheres;
a plurality of computers are coupled to the power supply via the busbar, wherein the busbar extends vertically along a rear portion of a rack holding the plurality of computers;
the battery charger is configured to float charge the battery;
the power-converter comprises:
    a switching regulator comprising:
        a plurality of field effect transistors; and
        a clock coupled to control gates of the field effect transistors;
    a transformer configured to transform an alternating current output of the switching regulator from one voltage and current to another voltage and current;
    a rectifier coupled to an output of the transformer; and
    a low-pass filter coupled to the output of the rectifier and operative to output power at the second current and the second voltage.

3. The device of claim 1, wherein the battery comprises:
a battery configured to output 48 volt DC power and occupying less than one cubic foot of volume.

4. The device of claim 1, wherein power-converter comprises: a switched-mode DC-to-DC power converter.

5. The device of claim 1, wherein the power-converter comprises a switching regulator comprising a plurality of field effect transistors.

6. The device of claim 1, wherein the power-converter is configured to convert incoming DC power from the battery to intermediate AC power at a frequency higher than 300 Hertz and convert the intermediate AC power to the output DC power at the second voltage and the second current.

7. The device of claim 1, wherein the power-converter comprises means for converting DC power.

8. The device of claim 1, wherein the interface comprises:
a pair of insulated electrical cables each having a plate at a distal end configured to be secured to a respective rail of a busbar by a respective bolt.

9. The device of claim 1, wherein the interface comprises:
three pairs of insulated electrical cables configured to couple to three parallel sets of busbars extending in parallel along a back of a rack.

10. The device of claim 1, wherein the interface comprises: means for interfacing to a busbar of a server rack.

11. The device of claim 1, wherein:
the first voltage is approximately four times the second voltage;
the first current is approximately one fourth the second current;
the battery occupies less than 0.5 cubic feet of volume; and
the second current is greater than 500 milliamps.

12. The device of claim 1, comprising:
a controller having:
    a communications interface;
    a microprocessor coupled to the network interface and one or more sensors of the power supply; and
    memory storing instructions that when executed by the microprocessor effectuate operations comprising:
        monitoring a state of the power supply.

13. The device of claim 12, wherein the operations comprise:
monitoring parameter of the battery; and
comparing the parameter to a threshold.

14. The device of claim 13, wherein the parameter is a temperature.

15. The device of claim 13, wherein the parameter is a value indicative of an amount of energy stored by the battery.

16. The device of claim 12, wherein the operations comprise: steps for monitoring a state of the power supply.

17. The device of claim 12, wherein the operations comprise:
receiving a signal indicating that computing equipment coupled to the power supply is not in use; and
in response to the signal, transitioning the power supply from a first mode of operation to a second mode of operation, the second mode of operation consuming less power than the first mode of operations.

18. The device of claim 1, comprising:
a rack configured to hold computing equipment and having a busbar coupled to the interface.

19. The device of claim 18, comprising:
a plurality of computing devices held by the rack and coupled to the busbar.

20. The device of claim 19, wherein:
the plurality of computing devices comprise memory storing instructions that when executed cause the computing devices to provide content for a web application.

21. The device of claim 1, wherein:
the bus-bar power interface provides an output current via bus-bars to rack-mounted computing equipment at a third current greater than the second current, the second current being a first component of the third current,
a second power supply provides a fourth current, the fourth current being a second component of the third current, and
the rack comprises at least two mounts configured to receive the first power supply and the second power supply, the at least two mounts exterior to a plurality of Us of the rack for holding computing equipment.

22. The device of claim 1, wherein:
the rack is one of at least three racks forming a datacenter chamber, each pair of adjacent racks defining, between the pair of racks, a respective wedge-shaped volume different from a volume of a plurality of Us of the pair of rack for holding computing equipment,
the power supply is one of at least three power supplies mounted within a wedge-shaped volume corresponding to the rack,
the bus-bar power interface of the rack provides an output current via bus-bars to rack-mounted computing equipment held within the rack at a third current greater than the second current, the second current being a first component of the third current,
a second power supply provides a fourth current, the fourth current being a second component of the third current, and
a third power supply provides a fifth current, the fifth current being a third component of the third current.

* * * * *